(12) United States Patent
Mikami et al.

(10) Patent No.: US 11,355,343 B2
(45) Date of Patent: Jun. 7, 2022

(54) LASER IRRADIATION APPARATUS, LASER IRRADIATION METHOD, AND METHOD OF MANUFACTURING SEMICONDUCTOR DEVICE

(71) Applicant: JSW AKTINA SYSTEM CO., LTD., Yokohama (JP)

(72) Inventors: Takahiro Mikami, Yokohama (JP); Takahiro Fuji, Yokohama (JP); Yuki Suzuki, Yokohama (JP); Yoshihiro Yamaguchi, Yokohama (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 637 days.

(21) Appl. No.: 16/327,842

(22) PCT Filed: Jun. 2, 2017

(86) PCT No.: PCT/JP2017/020641
§ 371 (c)(1),
(2) Date: Feb. 24, 2019

(87) PCT Pub. No.: WO2018/055840
PCT Pub. Date: Mar. 29, 2018

(65) Prior Publication Data
US 2019/0198326 A1 Jun. 27, 2019

(30) Foreign Application Priority Data
Sep. 21, 2016 (JP) ............................. JP2016-183676

(51) Int. Cl.
*H01L 21/268* (2006.01)
*H01L 21/02* (2006.01)
(Continued)

(52) U.S. Cl.
CPC ........ *H01L 21/268* (2013.01); *B23K 26/0006* (2013.01); *B23K 26/0732* (2013.01);
(Continued)

(58) Field of Classification Search
CPC ..... H01L 21/268; H01L 21/20; H01L 21/677; B65G 49/06
See application file for complete search history.

(56) References Cited

U.S. PATENT DOCUMENTS

| 2004/0084427 A1 | 5/2004 | Talwar et al. |
| 2004/0106242 A1 | 6/2004 | Arao et al. |

(Continued)

FOREIGN PATENT DOCUMENTS

| JP | 2002-231654 A | 8/2002 |
| JP | 2004-179653 A | 6/2004 |

(Continued)

OTHER PUBLICATIONS

Office Action dated Aug. 18, 2020, in Japanese Patent Application No. 2016-183676.

(Continued)

*Primary Examiner* — Kaitlin S Joerger
(74) *Attorney, Agent, or Firm* — SGPatents PLLC

(57) ABSTRACT

A laser irradiation apparatus (1) according to one embodiment includes a laser generating device (14) that generates a laser beam, a flotation unit (10) that causes a workpiece (16) that is to be irradiated with the laser beam to float, and a conveying unit (11) that conveys the floating workpiece (16). The conveying unit (11) conveys the workpiece (16) with the conveying unit (11) holding the workpiece (16) at a position where the conveying unit (11) does not overlap an irradiation position (15) of the laser beam. The laser irradiation apparatus (1) according to one embodiment makes it possible to suppress uneven irradiation with a laser beam.

17 Claims, 30 Drawing Sheets

(51) Int. Cl.
    *H01L 21/687* (2006.01)
    *H01L 21/683* (2006.01)
    *H01L 21/677* (2006.01)
    *B23K 26/073* (2006.01)
    *B65G 49/06* (2006.01)
    *B23K 26/352* (2014.01)
    *B23K 26/08* (2014.01)
    *B23K 26/00* (2014.01)
    *H01L 21/67* (2006.01)
    *B23K 37/047* (2006.01)
    *B65G 49/05* (2006.01)
    *B23K 103/00* (2006.01)
    *B23K 101/40* (2006.01)

(52) U.S. Cl.
    CPC ........ *B23K 26/0738* (2013.01); *B23K 26/083* (2013.01); *B23K 26/0823* (2013.01); *B23K 26/352* (2015.10); *B23K 37/047* (2013.01); *B65G 49/065* (2013.01); *H01L 21/02532* (2013.01); *H01L 21/02675* (2013.01); *H01L 21/02691* (2013.01); *H01L 21/677* (2013.01); *H01L 21/6776* (2013.01); *H01L 21/67115* (2013.01); *H01L 21/67715* (2013.01); *H01L 21/67784* (2013.01); *H01L 21/67787* (2013.01); *H01L 21/687* (2013.01); *H01L 21/6838* (2013.01); *B23K 2101/40* (2018.08); *B23K 2103/50* (2018.08); *B23K 2103/56* (2018.08); *B65G 49/05* (2013.01); *B65G 2249/04* (2013.01)

(56) References Cited

U.S. PATENT DOCUMENTS

| | | | |
|---|---|---|---|
| 2004/0164306 A1* | 8/2004 | Hongo | H01L 27/1285 257/88 |
| 2010/0065547 A1 | 3/2010 | Moffatt et al. | |
| 2014/0231812 A1 | 8/2014 | Nishida et al. | |
| 2019/0189449 A1* | 6/2019 | Shimizu | G01J 1/0414 |
| 2019/0193200 A1* | 6/2019 | Fuji | B23K 37/0408 |
| 2020/0006096 A1* | 1/2020 | Imamura | H01L 21/02675 |
| 2020/0219724 A1* | 7/2020 | Suzuki | B23K 26/354 |
| 2021/0020443 A1* | 1/2021 | Imamura | C30B 13/24 |
| 2021/0187659 A1* | 6/2021 | Yamaguchi | H01L 29/786 |

FOREIGN PATENT DOCUMENTS

| | | |
|---|---|---|
| JP | 2006-505953 A | 2/2006 |
| JP | 2009-010161 A | 1/2009 |
| JP | 2012-503311 A | 2/2012 |
| JP | 2012-182273 A | 9/2012 |
| WO | WO 2013/069056 A1 | 5/2013 |
| WO | WO 2014/148182 A1 | 9/2014 |
| WO | WO 2015/174347 A1 | 11/2015 |

OTHER PUBLICATIONS

International Search Report from International Patent Application No. PCT/JP2017/020641, dated Sep. 5, 2017.

\* cited by examiner

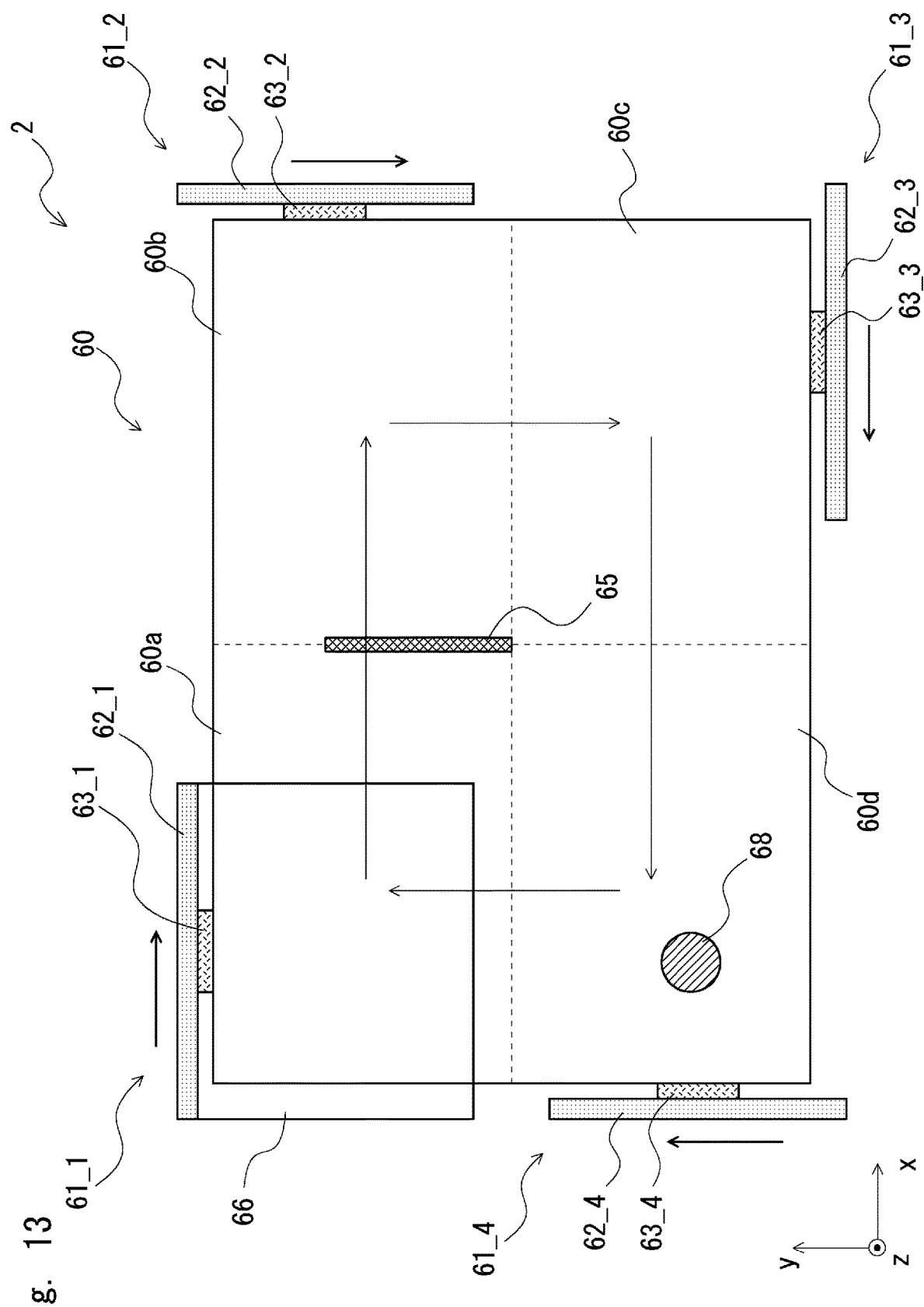

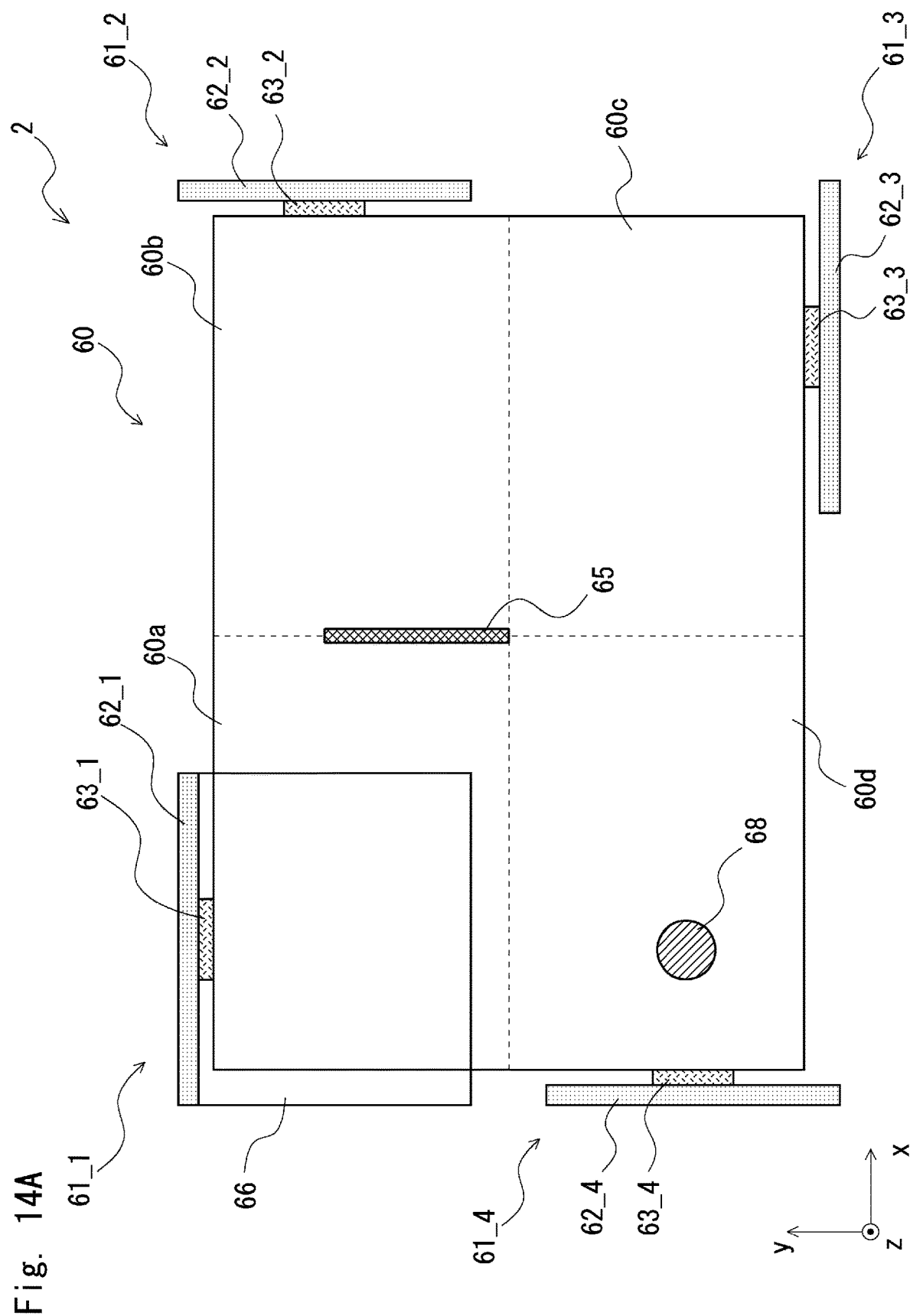

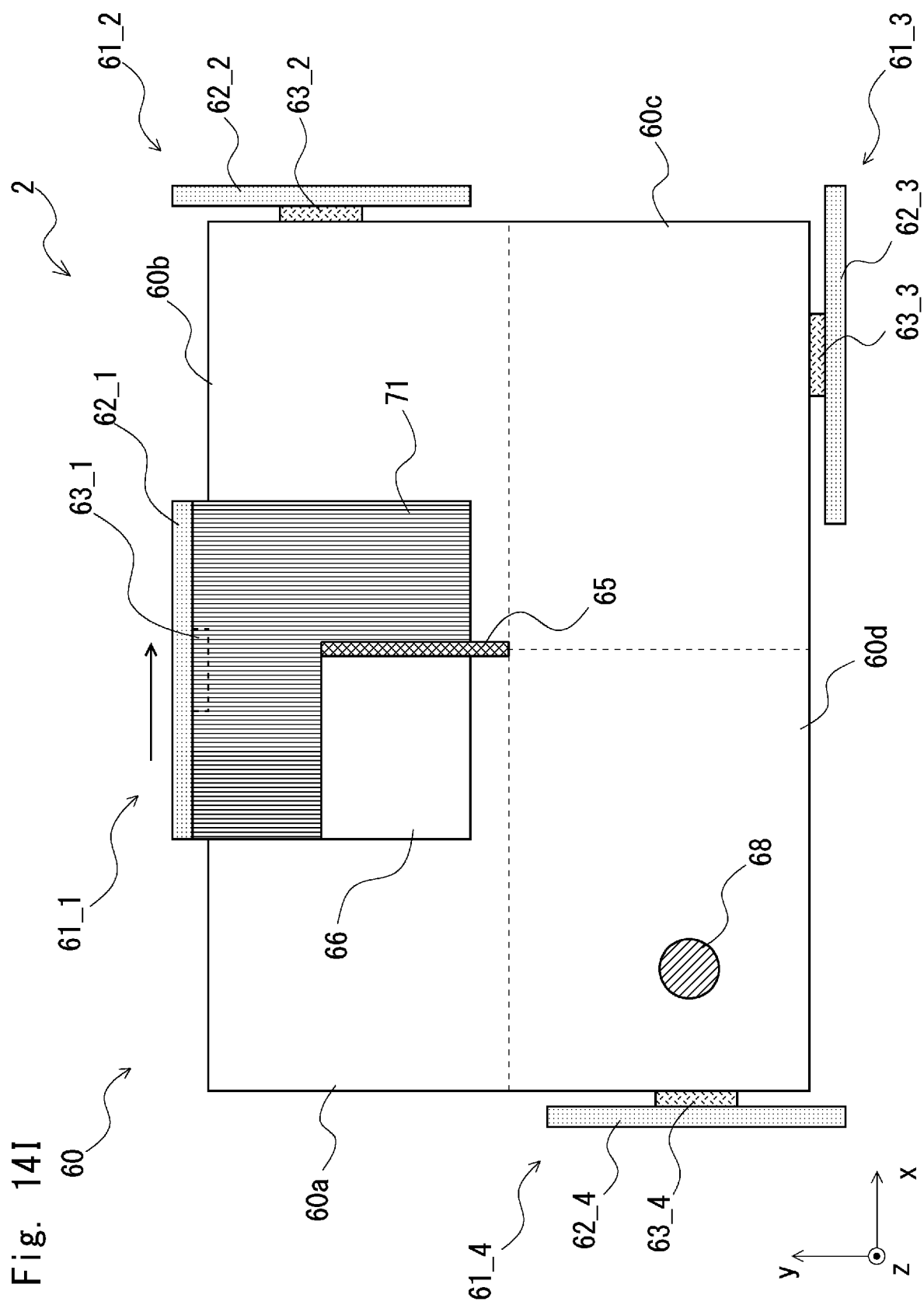

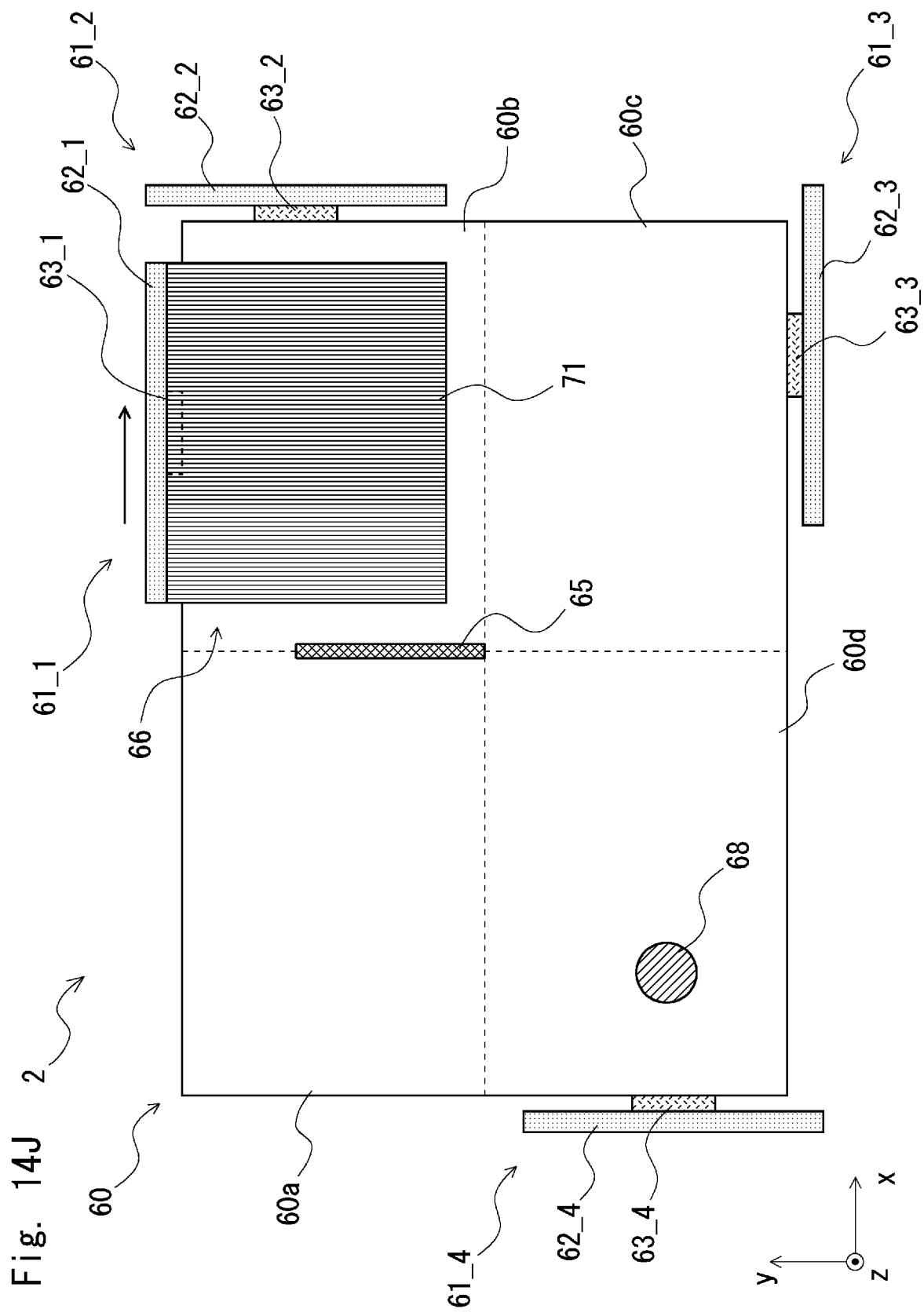

LASER IRRADIATION APPARATUS, LASER IRRADIATION METHOD, AND METHOD OF MANUFACTURING SEMICONDUCTOR DEVICE

TECHNICAL FIELD

The present invention relates to laser irradiation apparatuses, laser irradiation methods, and methods of manufacturing semiconductor devices. For example, the present invention relates to a laser irradiation apparatus provided with a conveying unit that conveys a workpiece, a laser irradiation method, and a method of manufacturing a semiconductor device.

BACKGROUND ART

There is known a laser annealing apparatus that irradiates an amorphous film formed on a silicon substrate, a glass substrate, or the like with a laser beam to crystallize the amorphous film. Patent Literature 1 discloses a laser annealing apparatus that conveys a substrate with a conveying unit while causing the substrate to float with the use of a flotation unit and irradiates the substrate with a laser beam. Patent Literature 2 discloses a laser machining apparatus that irradiates an object to be processed with a laser beam to process the object.

CITATION LIST

Patent Literature

Patent Literature 1: Japanese Unexamined Patent Application Publication No. 2002-231654
Patent Literature 2: Japanese Unexamined Patent Application Publication No. 2009-10161

SUMMARY OF INVENTION

Technical Problem

According to the technique disclosed in Patent Literature 1, the substrate is conveyed with the conveying unit while the substrate is being caused to float with the use of the flotation unit, and the substrate is irradiated with a laser beam. When the substrate is conveyed with the conveying unit, the substrate is held by the conveying unit. At the position on the substrate where the substrate is held by the conveying unit, stress is propagated to the substrate from the conveying unit while the substrate is being conveyed, and the substrate is thus likely to be deflected. Therefore, in a case in which the conveying unit passes through the irradiation position of the laser beam, as in the technique disclosed in Patent Literature 1, the substrate is deflected in the vicinity of the position where the substrate is held by the conveying unit, and the substrate goes off the depth of focus (DOF) of the laser beam, leading to a problem in that the substrate is unevenly irradiated with the laser beam.

Other issues and novel features will become apparent from the descriptions in the present specification and the appended drawings.

Solution to Problem

A laser irradiation apparatus according to one embodiment includes a conveying unit that conveys a workpiece. The conveying unit conveys the workpiece with the conveying unit holding the workpiece at a position where the conveying unit does not overlap an irradiation position of a laser beam.

Advantageous Effects of Invention

The foregoing embodiment can provide a laser irradiation apparatus, a laser irradiation method, and a method of manufacturing a semiconductor device that can suppress uneven irradiation with a laser beam.

BRIEF DESCRIPTION OF THE DRAWINGS

FIG. 13 is a plan view for describing a laser irradiation apparatus according to a second embodiment.
FIG. 14A is a plan view illustrating an operation of the laser irradiation apparatus according to the second embodiment.

FIG. 14I is a plan view illustrating an operation of the laser irradiation apparatus according to the second embodiment.

FIG. 14J is a plan view illustrating an operation of the laser irradiation apparatus according to the second embodiment.

DESCRIPTION OF EMBODIMENTS

Description on Laser Irradiation Apparatus (Comparative Example)

First, a laser irradiation apparatus according to a comparative example will be described.

Figure 1:
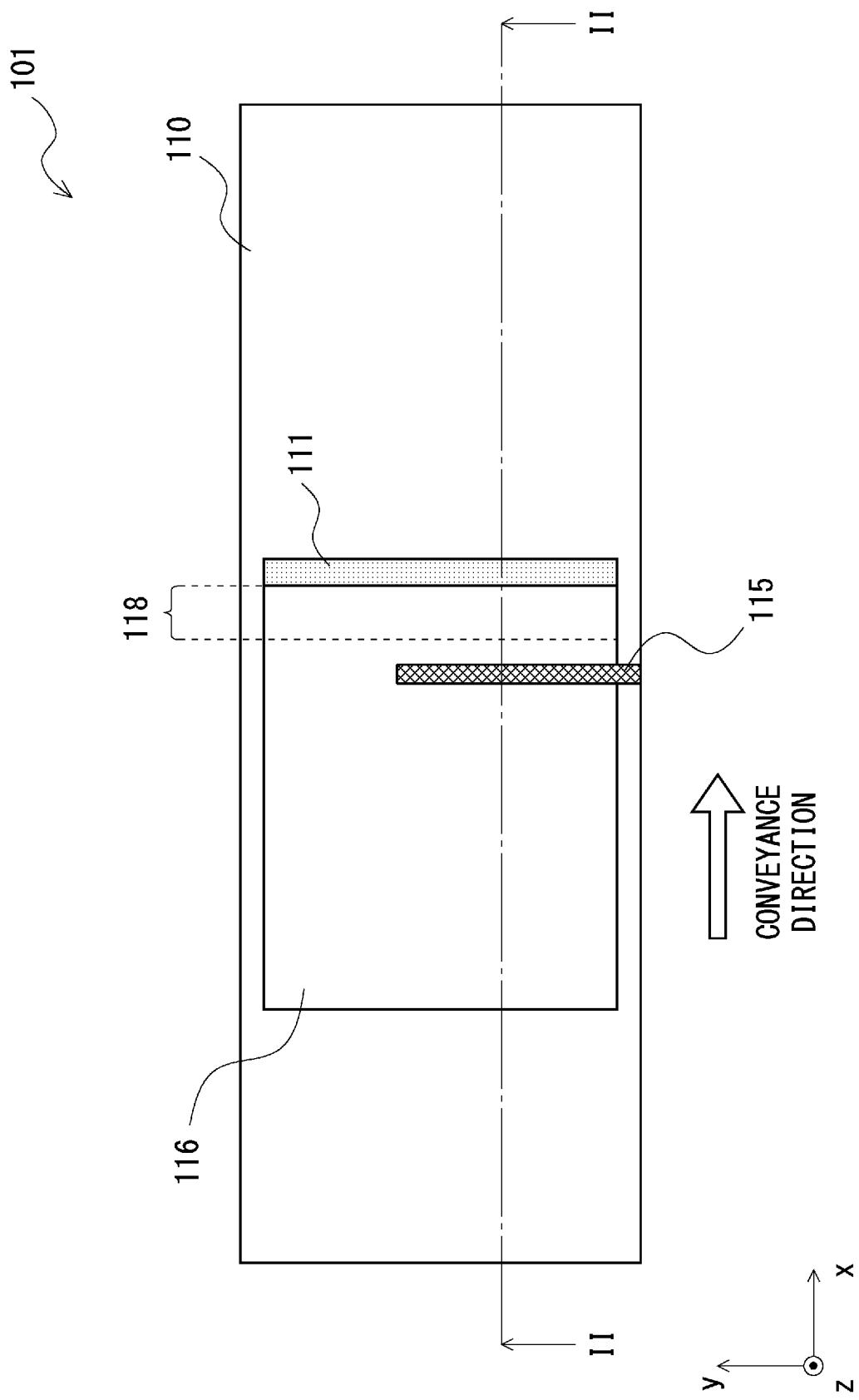
FIG. 1 is a plan view for describing a laser irradiation apparatus according to a comparative example.
Figure 2:
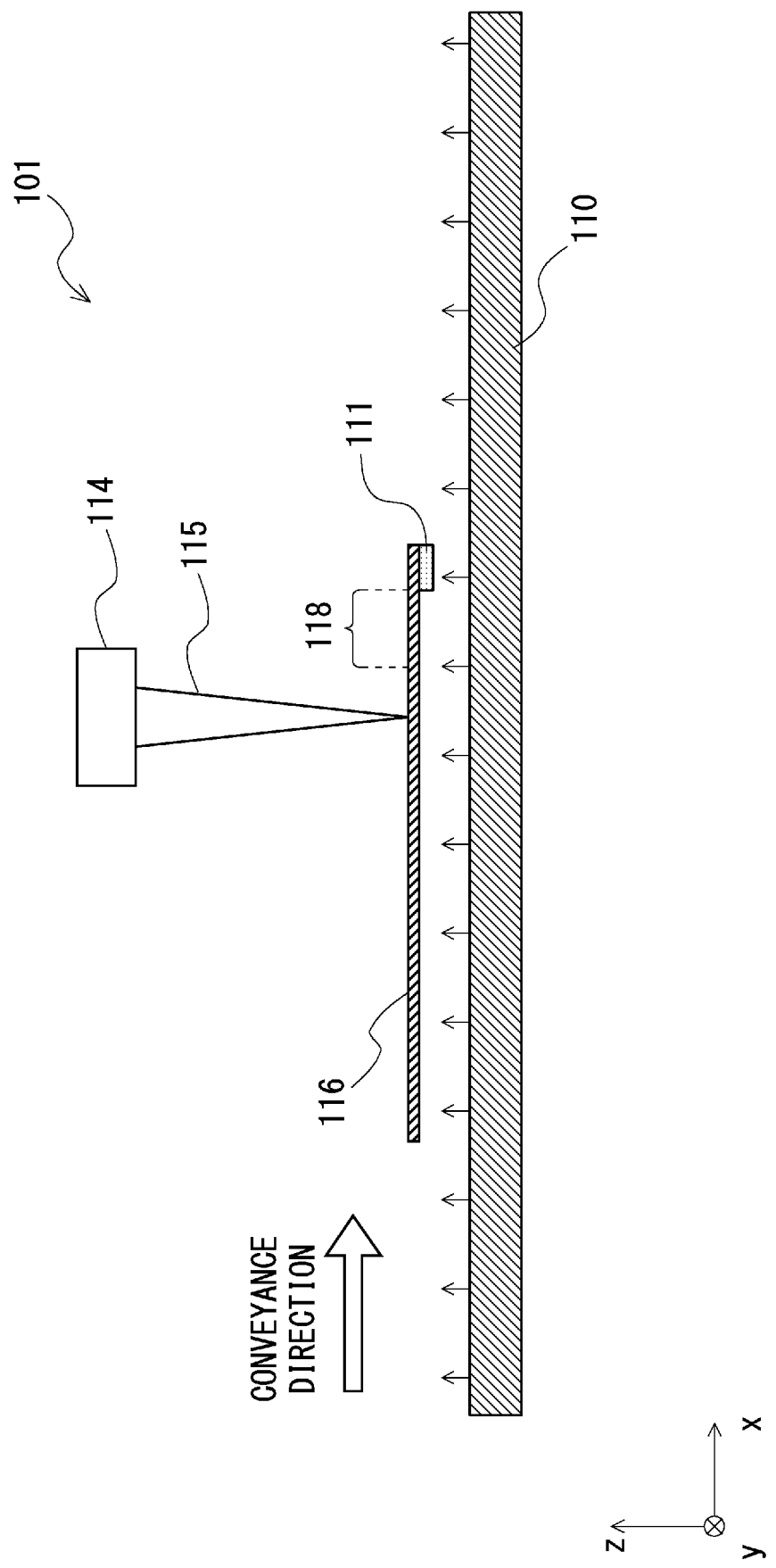
FIG. 2 is a sectional view of the laser irradiation apparatus illustrated in FIG. 1, taken along the cutting-plane line II-II.

FIG. 1 is a plan view for describing the laser irradiation apparatus according to the comparative example. FIG. 2 is a sectional view of the laser irradiation apparatus illustrated in FIG. 1, taken along the cutting-plane line II-II. As illustrated in FIGS. 1 and 2, a laser irradiation apparatus 101 includes a flotation unit 110, a conveying unit 111, and a laser light source 114.

As illustrated in FIG. 2, the flotation unit 110 is configured to eject a gas from a surface of the flotation unit 110. The gas ejected from the surface of the flotation unit 110 is blown against a lower surface of a workpiece 116, and thus the workpiece 116 floats. The workpiece 116 is, for example, a glass substrate.

The conveying unit 111 holds a downstream-side edge portion of the workpiece 116 in the conveyance direction and conveys the workpiece 116 in the conveyance direction (x-axis direction). For example, the conveying unit 111 includes a vacuum suction mechanism of a suction cup type, a vacuum suction mechanism provided with a porous member, or the like. Such a vacuum suction mechanism is coupled to a discharge port (not illustrated), and the discharge port is coupled to an ejector, a vacuum pump, or the like. Thus, a negative pressure for sucking in a gas acts in the vacuum suction mechanism, and the workpiece 116 can be held with the use of the vacuum suction mechanism. The conveying unit 111, while holding the workpiece 116, conveys the workpiece 116 in the conveyance direction with the use of a moving mechanism (not illustrated).

The workpiece 116 is irradiated with a laser beam 115 (hereinafter, the irradiation position of the laser beam is also denoted by the reference numeral 115). For example, the laser irradiation apparatus is a laser annealing apparatus. In this case, an excimer laser or the like can be used as the laser generating device 114. A laser beam supplied from the laser generating device 114 is made to have a line shape by an optical system (not illustrated), and the workpiece 116 is irradiated with a line-shaped laser beam 115 (line beam) that, specifically, has a focal point extending in the y-axis direction (see FIG. 1). The workpiece 116 is, for example, an amorphous film formed on a substrate. This amorphous film is irradiated with the laser beam 115 to be annealed, and thus the amorphous film can be crystallized.

In the laser irradiation apparatus according to the comparative example illustrated in FIGS. 1 and 2, while the workpiece 116 is caused to float with the use of the flotation unit 110, the lower surface of the workpiece 116 is held by the conveying unit 111, and the workpiece 116 is conveyed in the conveyance direction. At this point, the conveying unit 111 holds the entire downstream-side edge portion of the workpiece 116 in the conveyance direction from the lower surface side of the workpiece 116.

In this case, at the position on the workpiece 116 where the workpiece 116 is held by the conveying unit 111, stress is propagated to the workpiece 116 from the conveying unit 111 while the workpiece 116 is being conveyed, and thus the workpiece 116 is likely to be deflected. Therefore, in a case in which the conveying unit 111 is configured to pass through the laser irradiation position 115, the workpiece 116 is deflected in the vicinity of the position where the workpiece 116 is held by the conveying unit 111, and the workpiece 116 goes off the depth of focus (DOF) of the laser beam, leading to a problem in that the workpiece 116 is unevenly irradiated with the laser beam.

Specifically, as illustrated in FIGS. 1 and 2, at the position on the workpiece 116 where the workpiece 116 is held by the conveying unit 111, stress is likely to be propagated to the workpiece 116 from the conveying unit 111 while the workpiece 116 is being conveyed. Thus, the workpiece 116 is likely to be deflected in the thickness direction of the workpiece 116 (z-axis direction) in the vicinity of the region of the workpiece 116 that is indicated by the reference numeral 118. Therefore, in a case in which the conveying unit 111 is configured to pass through the laser irradiation position 115, the workpiece 116 is deflected in the region of the workpiece 116 that is indicated by the reference numeral 118, and the workpiece 116 goes off the depth of focus (DOF) of the laser beam, leading to a problem in that the workpiece 116 is unevenly irradiated with the laser beam.

Figure 3:
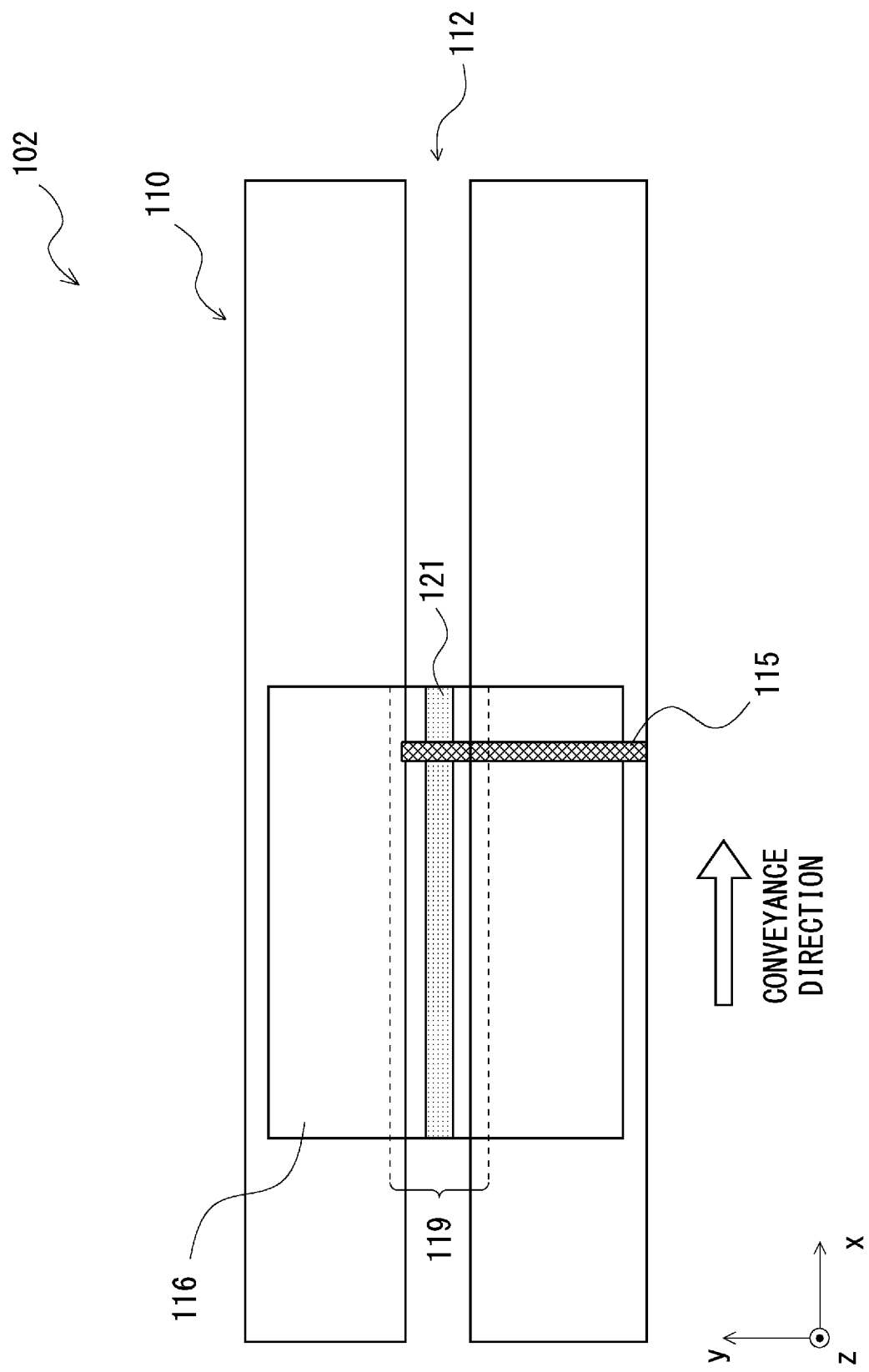
FIG. 3 is a plan view for describing another configuration of a laser irradiation apparatus according to a comparative example.

This problem arises similarly in a laser irradiation apparatus 102 illustrated in FIG. 3, in which a conveying unit 121 holds a workpiece 116 in the vicinity of its middle portion along the conveyance direction of the workpiece 116. In other words, in the laser irradiation apparatus 102 illustrated in FIG. 3, at the position on the workpiece 116 where the workpiece 116 is held by the conveying unit 121, stress is likely to be propagated to the workpiece 116 from the conveying unit 121 while the workpiece 116 is being conveyed. Thus, the workpiece 116 is likely to be deflected in the thickness direction of the workpiece 116 (z-axis direction) in the vicinity of a region of the workpiece 116 that is indicated by the reference numeral 119. Therefore, in a case where the conveying unit 121 is configured to pass through the laser irradiation position 115, the workpiece 116 is deflected in the region of the workpiece 116 that is indicated by the reference numeral 119, and the workpiece 116 goes off the depth of focus (DOF) of the laser beam, leading to a problem in that the workpiece 116 is unevenly irradiated with the laser beam. In the laser irradiation apparatus 102 illustrated in FIG. 3, in order to provide the conveying unit 121 at a middle portion of the flotation unit 110, the flotation unit 110 is divided at its middle portion, and a space 112 is provided to allow the conveying unit 121 to pass therethrough.

In the following embodiments, a laser irradiation apparatus, a laser irradiation method, and a method of manufacturing a semiconductor device that can solve the above problem will be described.

First Embodiment

Figure 4:
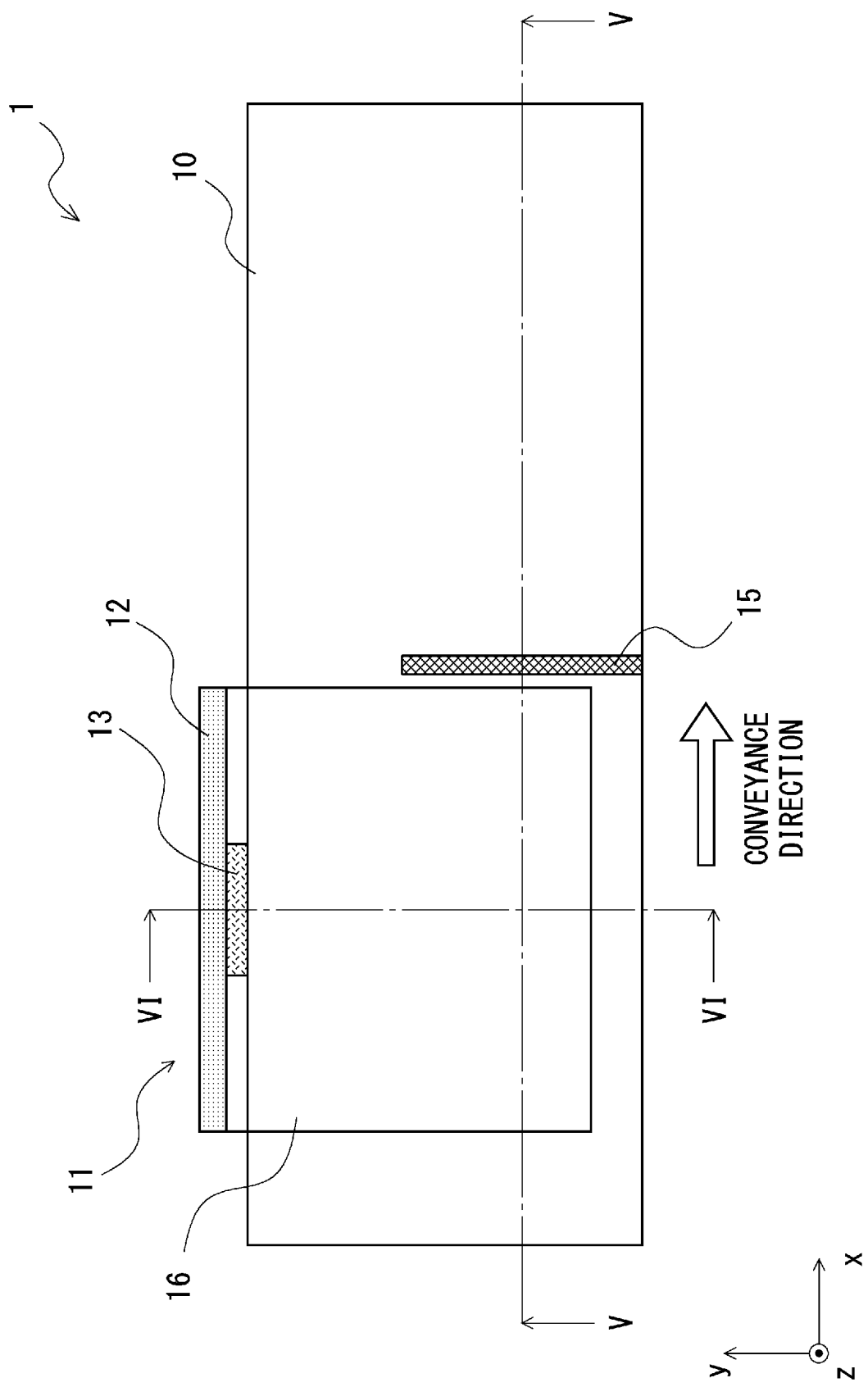
FIG. 4 is a plan view for describing a laser irradiation apparatus according to a first embodiment.
Figure 5:
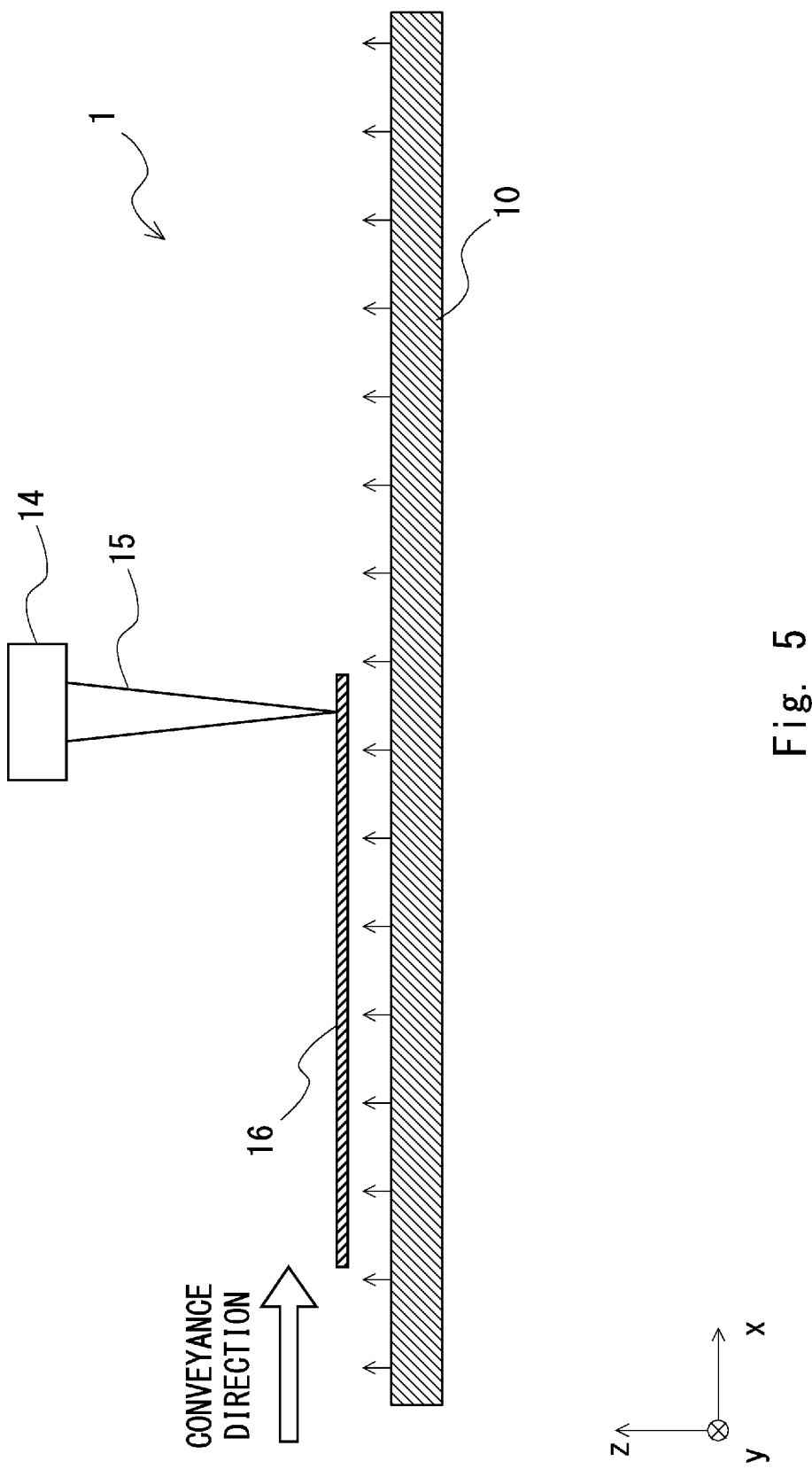
FIG. 5 is a sectional view of the laser irradiation apparatus illustrated in FIG. 4, taken along the cutting-plane line V-V.
Figure 6:
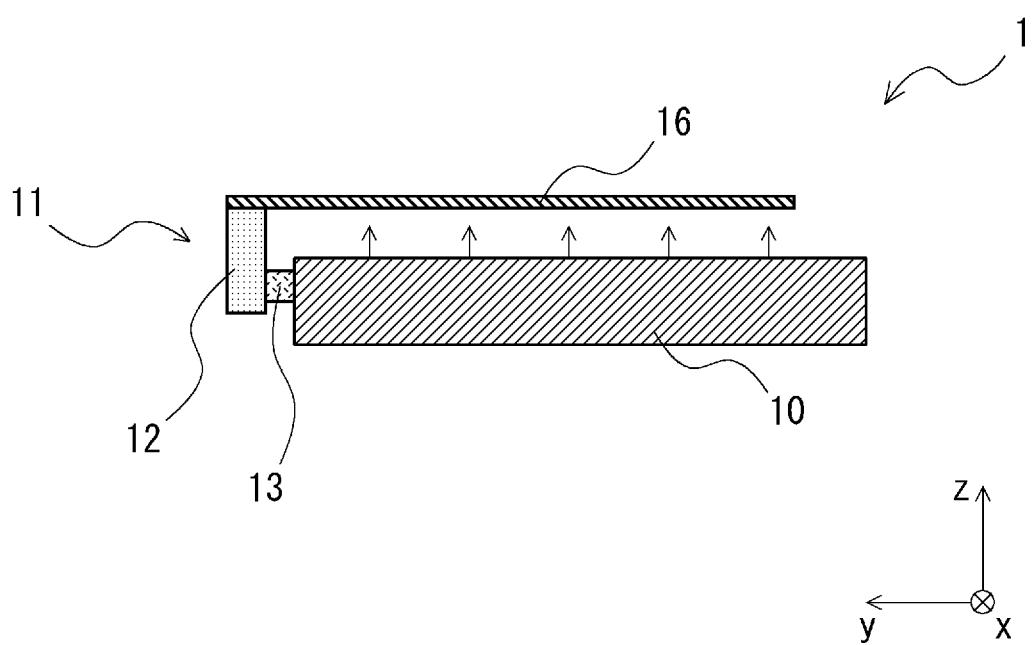
FIG. 6 is a sectional view of the laser irradiation apparatus illustrated in FIG. 4, taken along the cutting-plane line VI-VI.

Hereinafter, a laser irradiation apparatus according to a first embodiment will be described with reference to the drawings. FIG. 4 is a plan view for describing the laser irradiation apparatus according to the first embodiment. FIG. 5 is a sectional view of the laser irradiation apparatus illustrated in FIG. 4, taken along the cutting-plane line V-V. FIG. 6 is a sectional view of the laser irradiation apparatus illustrated in FIG. 4, taken along the cutting-plane line VI-VI.

As illustrated in FIGS. 4 to 6, a laser irradiation apparatus 1 includes a flotation unit 10, a conveying unit 11, and a laser light source 14. As illustrated in FIG. 5, the flotation unit 10 is configured to eject a gas from a surface of the flotation unit 10. The gas ejected from the surface of the flotation unit 10 is blown against a lower surface of a workpiece 16, and thus the workpiece 16 floats. The workpiece 16 is, for example, a glass substrate. While the workpiece 16 is being conveyed, the flotation unit 10 adjusts the floating amount such that the workpiece 16 does not make contact with another mechanism (not illustrated) disposed over the workpiece 16.

The conveying unit 11 conveys the floating workpiece 16 in a conveyance direction (x-axis direction). As illustrated in FIGS. 4 and 6, the conveying unit 11 includes a holding mechanism 12 and a moving mechanism 13. The holding mechanism 12 holds the workpiece 16. For example, the holding mechanism 12 can be constituted by a vacuum suction mechanism of a suction cup type, a vacuum suction mechanism provided with a porous member, or the like. The holding mechanism 12 (vacuum suction mechanism) is coupled to a discharge port (not illustrated), and the discharge port is coupled to an ejector, a vacuum pump, or the like. Thus, a negative pressure for sucking in a gas acts in the holding mechanism 12, and the workpiece 16 can be held with the use of the holding mechanism 12.

In the present embodiment, as illustrated in FIG. 6, the holding mechanism 12 holds the workpiece 16 by sucking the surface (lower surface) of the workpiece 16 that is opposite to its surface (upper surface) to be irradiated with a laser beam, that is, by sucking the surface of the workpiece 16 that is to oppose the flotation unit 10. In addition, the holding mechanism 12 holds an edge portion of the workpiece 16 in the y-axis direction (i.e., an edge portion of the workpiece 16 in a direction perpendicular to the conveyance direction).

The moving mechanism 13 included in the conveying unit 11 is coupled to the holding mechanism 12. The moving mechanism 13 is configured to be capable of moving the holding mechanism 12 in the conveyance direction (x-axis direction). The conveying unit 11 (holding mechanism 12 and moving mechanism 13) is provided on an edge portion of the flotation unit 10 in the y-axis direction, and the workpiece 16 is conveyed as the moving mechanism 13 moves in the conveyance direction with the holding mechanism 12 holding the workpiece 16.

As illustrated in FIG. 4, for example, the moving mechanism 13 is configured to slide in the x-axis direction along an edge portion of the flotation unit 10 in the y-axis direction. As the moving mechanism 13 slides in the x-axis direction along the edge portion of the flotation unit 10, the workpiece 16 is conveyed along the x-axis. At this point, the conveyance speed of the workpiece 16 can be controlled by controlling the moving speed of the moving mechanism 13.

As illustrated in FIGS. 4 and 5, the workpiece 16 is irradiated with a laser beam 15 (hereinafter, the irradiation position of the laser beam is also denoted by the reference numeral 15). For example, the laser irradiation apparatus is a laser annealing apparatus. In this case, an excimer laser or the like can be used as the laser generating device 14. A laser beam supplied from the laser generating device 14 is made to have a line shape by an optical system (not illustrated), and the workpiece 16 is irradiated with a line-shaped laser beam 15 (line beam) that, specifically, has a focal point extending in the y-axis direction (see FIG. 4). To rephrase, the irradiation position of the laser beam 15 on the workpiece 16 extends in a direction (y-axis direction) perpendicular to the conveyance direction (x-axis direction) of the workpiece 16. The workpiece 16 is, for example, an amorphous film formed on a substrate. This amorphous film is irradiated with the laser beam 15 to be annealed, and thus the amorphous film can be crystallized.

In the laser irradiation apparatus 1 illustrated in FIGS. 4 to 6, while the workpiece 16 is being caused to float with the use of the flotation unit 10, the lower surface of the workpiece 16 is held by the conveying unit 11, and the workpiece 16 is conveyed in the conveyance direction. At this point, when conveying the workpiece 16, the conveying unit 11 included in the laser irradiation apparatus 1 conveys the workpiece 16 with the conveying unit 11 holding the workpiece 16 at a position where the conveying unit 11 does not overlap the laser irradiation position 15 as viewed in a plan view (i.e., as viewed in the z-axis direction). In other words, as illustrated in FIG. 4, when conveying the workpiece 16 in the conveyance direction, the conveying unit 11 holds the workpiece 16 at a position (corresponding to the position of the holding mechanism 12) that does not overlap the laser irradiation position 15.

For example, the planar shape of the workpiece 16 is a quadrangle (rectangle) having four sides, and the conveying unit 11 (holding mechanism 12) holds only one of the four sides of the workpiece 16. The conveying unit 11 (holding mechanism 12) holds the workpiece 16 at a position that is not irradiated with the laser beam while the workpiece 16 is being conveyed.

Such a configuration allows the laser irradiation position 15 and the position (corresponding to the position of the holding mechanism 12) on the workpiece 16 where the workpiece 16 is held by the conveying unit 11 to be spaced apart from each other. Thus, any influence of deflection of the workpiece 16 during laser irradiation can be reduced.

Specifically, if stress is propagated to the workpiece 16 from the conveying unit 11 while the workpiece 16 is being conveyed, the workpiece 16 is deflected in its thickness direction (z-axis direction) in the vicinity of the position (corresponding to the position of the holding mechanism 12) on the workpiece 16 where the conveying unit 11 holds the workpiece 16. Thus, if the workpiece 16 is irradiated with the laser beam 15 at the stated position, the workpiece 16 goes out the depth of focus (DOF) of the laser beam, leading to a problem in that the workpiece 16 is unevenly irradiated with the laser beam (see the comparative examples illustrated in FIGS. 1 to 3).

In contrast, in the present embodiment, the conveying unit 11 holds the workpiece 16 at a position (corresponding to the position of the holding mechanism 12) that does not overlap the laser irradiation position 15. Specifically, as illustrated in FIG. 4, the holding mechanism 12 is configured to hold the edge portion of the workpiece 16 in the y-axis direction. In addition, the laser irradiation position 15 is located away from the conveying unit 11. In the example illustrated in FIG. 4, the laser irradiation position 15 is so located as to extend from the negative-side edge portion of the flotation unit 10 in the y-axis direction to the vicinity of the middle portion of the flotation unit 10. The length of the laser irradiation position 15 in the y-axis direction is approximately one half the length of the flotation unit 10 (workpiece 16) in the y-axis direction.

Such a configuration allows the laser irradiation position 15 and the position (corresponding to the position of the holding mechanism 12) on the workpiece 16 where the workpiece 16 is held by the conveying unit 11 to be spaced apart from each other, and any influence of deflection of the workpiece 16 during laser irradiation can be reduced.

Accordingly, a laser irradiation apparatus that can suppress uneven irradiation with a laser beam can be provided.

In the laser irradiation apparatus 101 according to a comparative example illustrated in FIG. 1, the workpiece 116 is irradiated with the laser beam 115 directly above the conveying unit 111 as well, and this may also lead to uneven irradiation with the laser beam 115. In contrast, in the present embodiment, as illustrated in FIG. 4, the conveying unit 11 holds the workpiece 16 at a position (corresponding to the position of the holding mechanism 12) that does not overlap the laser irradiation position 15. Accordingly, uneven irradiation with the laser beam can be suppressed.

In the laser irradiation apparatus 102 according to a comparative example illustrated in FIG. 3, the conveying unit 121 is provided at a middle portion of the flotation unit 110; thus, the flotation unit 110 needs to be divided at its middle portion, and the space 112 needs to be provided to allow the conveying unit 121 to pass therethrough. In contrast, in the present embodiment, as illustrated in FIG. 4, the conveying unit 11 is provided at the edge portion of the flotation unit 10 in the y-axis direction, and this renders it unnecessary to divide the flotation unit 10.

Next, an operation carried out when the laser irradiation apparatus 1 according to the present embodiment irradiates the workpiece 16 with a laser beam will be described. In the laser irradiation apparatus 1 illustrated in FIG. 4, the workpiece 16 can be irradiated with the laser beam 15 as the workpiece 16 is conveyed in the conveyance direction. In the laser irradiation apparatus 1 illustrated in FIG. 4, the length of the laser irradiation position 15 in the y-axis direction is approximately one half the length of the workpiece 16 in the y-axis direction. The laser irradiation position 15 is located in the negative side of the flotation unit 10 in the y-axis direction, and a half of the region on the workpiece 16 in the y-axis direction is irradiated with the laser beam when the workpiece 16 passes through the laser irradiation position 15.

In the laser irradiation apparatus 1 illustrated in FIG. 4, the workpiece 16 is so conveyed as to reciprocate between the positive side and the negative side in the x-axis direction, and the workpiece 16 is irradiated with the laser beam 15 in multiple batches. Thus, the entire surface of the workpiece 16 can be irradiated with the laser beam.

Figure 7A:
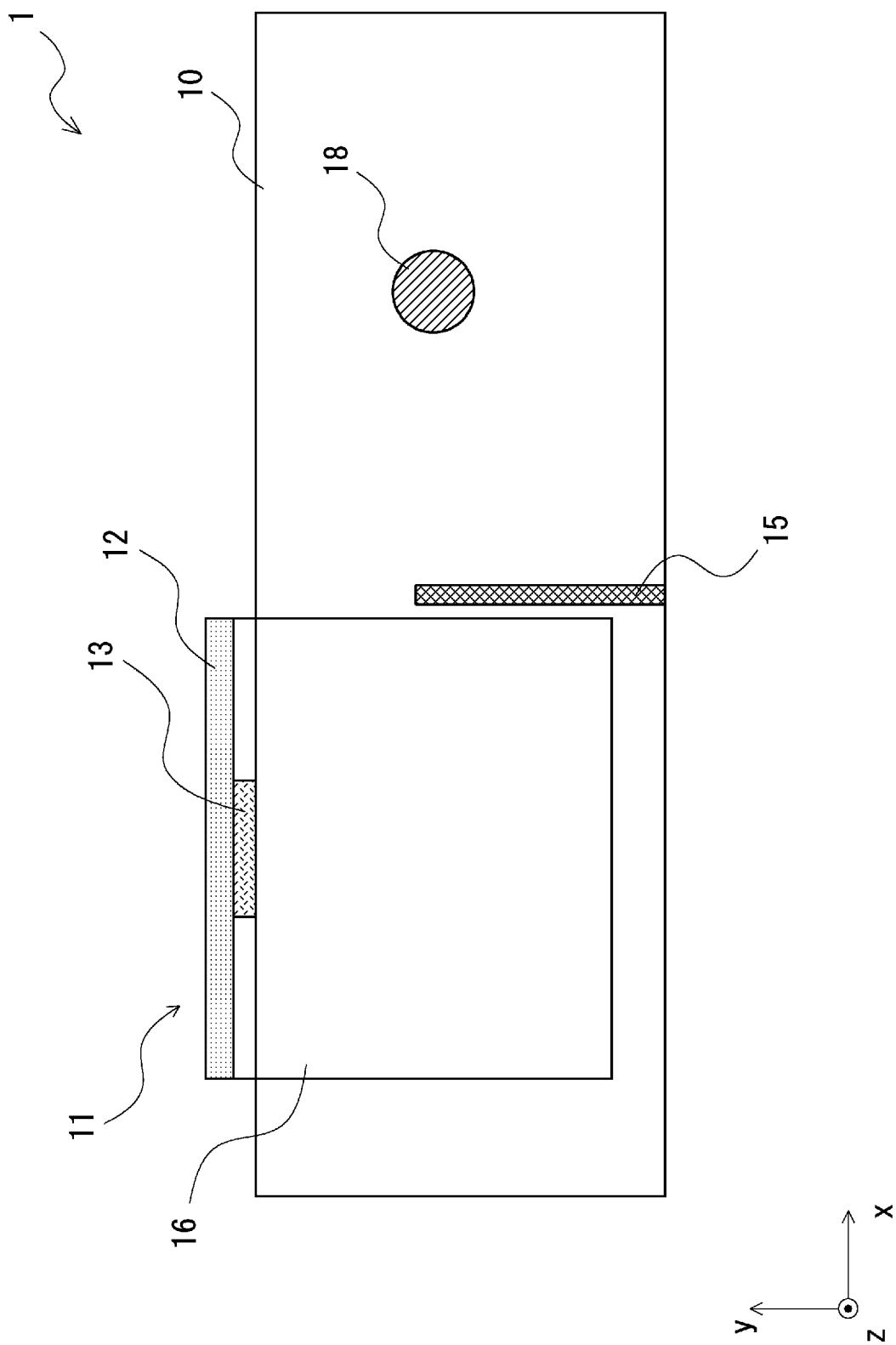
FIG. 7A is a plan view illustrating an operation of the laser irradiation apparatus according to the first embodiment.

In a case in which the workpiece 16 is to be conveyed in such a reciprocating manner, as illustrated in FIG. 7A, a rotating mechanism 18 that rotates the workpiece 16 by 180 degrees with the rotating mechanism 18 holding a horizontal surface (in the xy-plane) of the workpiece 16 is provided in the downstream side of the flotation unit 10 in the conveyance direction (x-axis direction). In other words, the laser irradiation apparatus 1, after conveying the workpiece 16 in the conveyance direction with the use of the conveying unit 11 and irradiating the workpiece 16 with the laser beam 15, rotates the workpiece 16 by 180 degrees with the use of the rotating mechanism 18 and conveys the workpiece 16 in a direction opposite to the conveyance direction to have the workpiece 16 irradiated with the laser beam 15. Thus, the laser irradiation apparatus 1 can irradiate the entire surface of the workpiece 16 with the laser beam. Hereinafter, the operation carried out in this case will be described in detail with reference to FIGS. 7A to 7F.

Figure 7B:
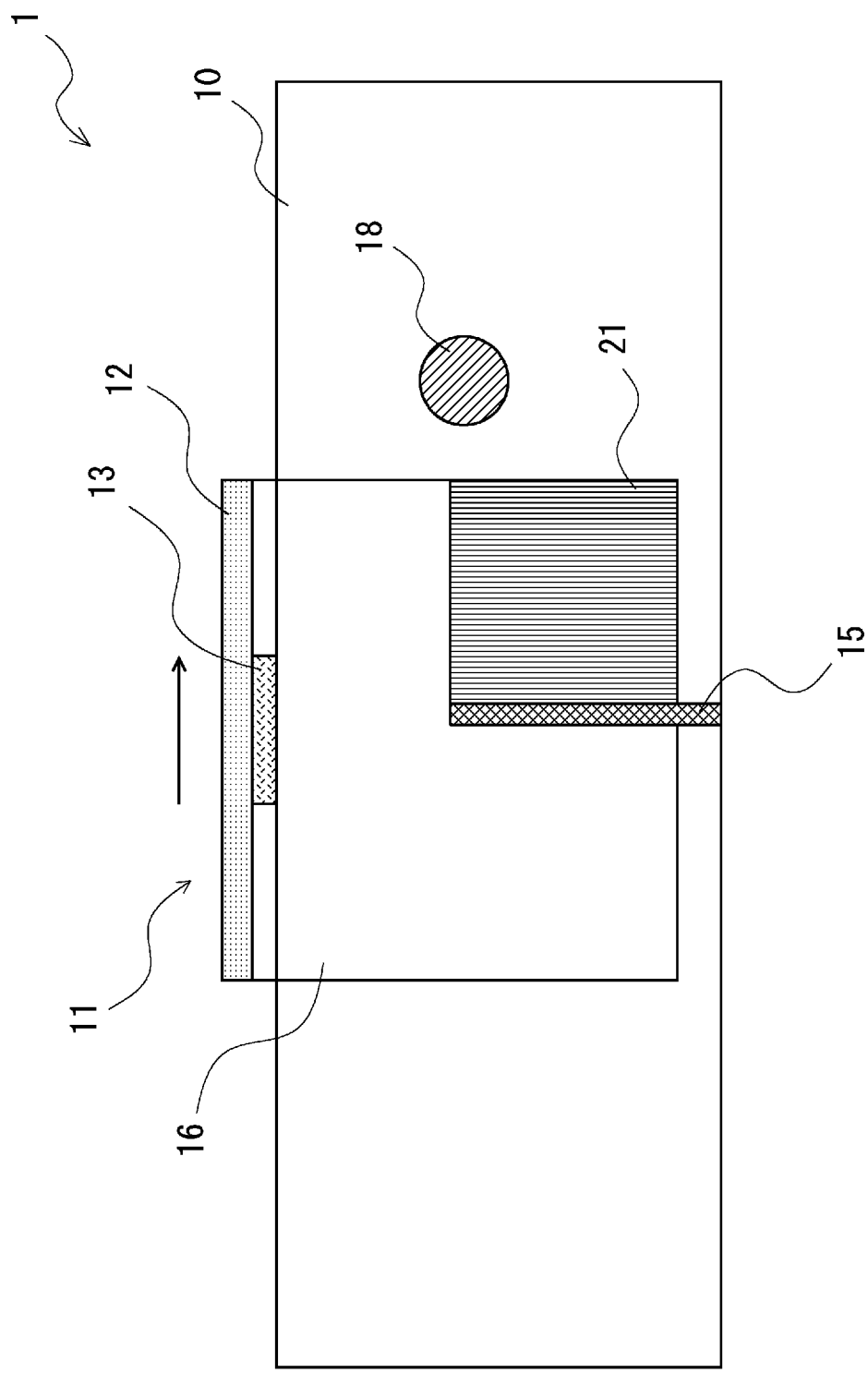
FIG. 7B is a plan view illustrating an operation of the laser irradiation apparatus according to the first embodiment.

As illustrated in FIG. 7A, when the workpiece 16 is to be irradiated with the laser beam 15 with the use of the laser irradiation apparatus 1, first, the lower surface (the surface that is to oppose the flotation unit 10) of the edge portion of the workpiece 16 in the y-axis direction is held by the holding mechanism 12 of the conveying unit 11. Thereafter, as illustrated in FIG. 7B, the moving mechanism 13 of the conveying unit 11 is moved toward the positive side in the x-axis direction with the holding mechanism 12 holding the workpiece 16, and the workpiece 16 is conveyed toward the positive side in the x-axis direction. Thus, a half of the region on the workpiece 16 is irradiated with the laser beam 15 (the region having been irradiated with the laser beam is indicated by the reference numeral 21).

Figure 7C:
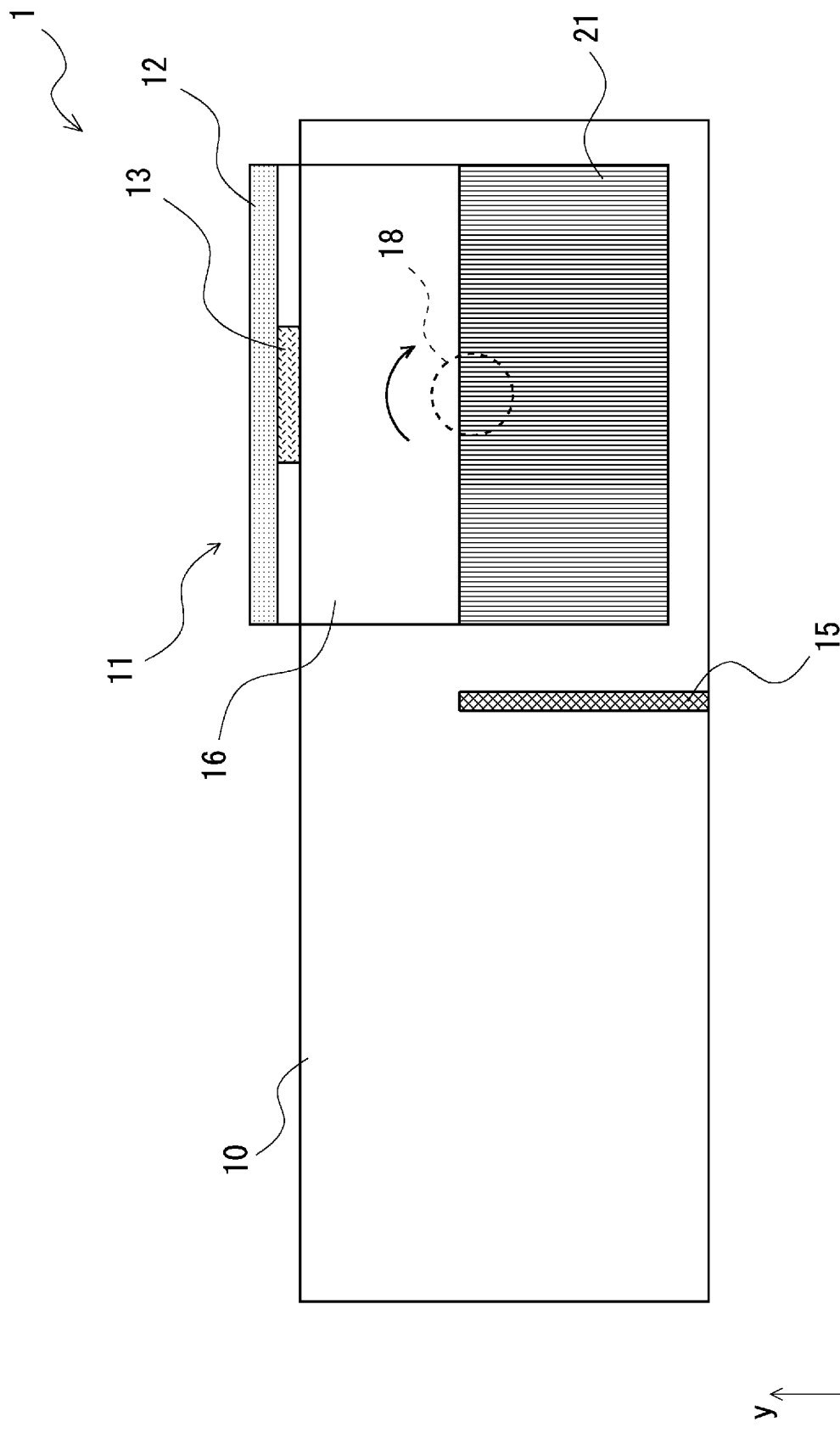
FIG. 7C is a plan view illustrating an operation of the laser irradiation apparatus according to the first embodiment.
Figure 7D:
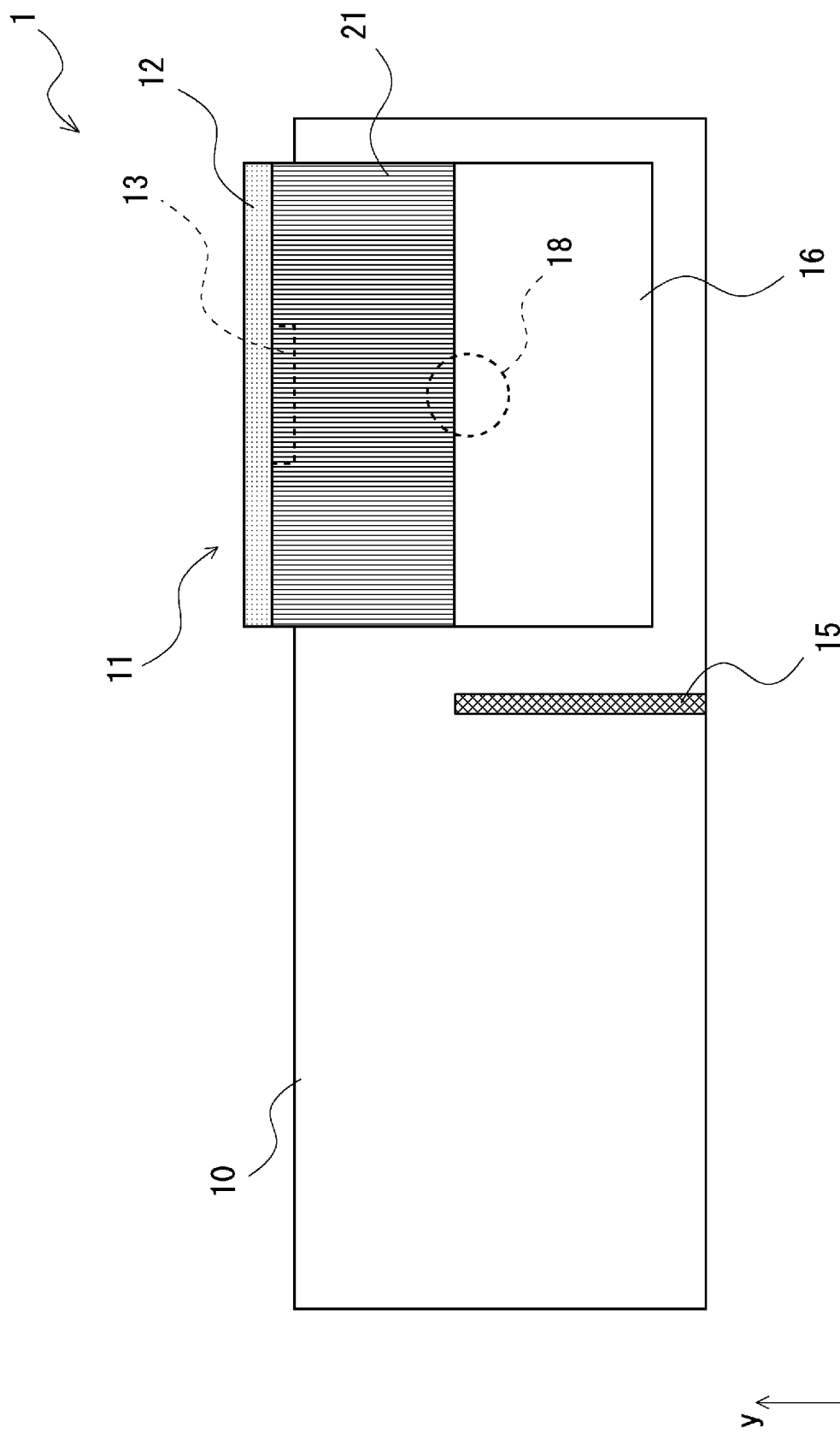
FIG. 7D is a plan view illustrating an operation of the laser irradiation apparatus according to the first embodiment.

Thereafter, as illustrated in FIG. 7C, the workpiece 16 is conveyed toward the positive side in the x-axis direction. Upon the workpiece 16 reaching a position above the rotating mechanism 18, the holding state of the holding mechanism 12 is released to provide a state in which the holding mechanism 12 is not holding the workpiece 16. While the workpiece 16 is being placed on the rotating mechanism 18, the rotating mechanism 18 is rotated by 180 degrees. This allows the workpiece 16 to be rotated by 180 degrees, and the region 21 on the workpiece 16 that has been irradiated with the laser beam is relocated from the negative side in the y-axis direction to the positive side in the y-axis direction, as illustrated in FIG. 7D. Thereafter, the lower surface of the edge portion of the workpiece 16 in the y-axis direction is held by the holding mechanism 12 of the conveying unit 11.

Figure 7E:
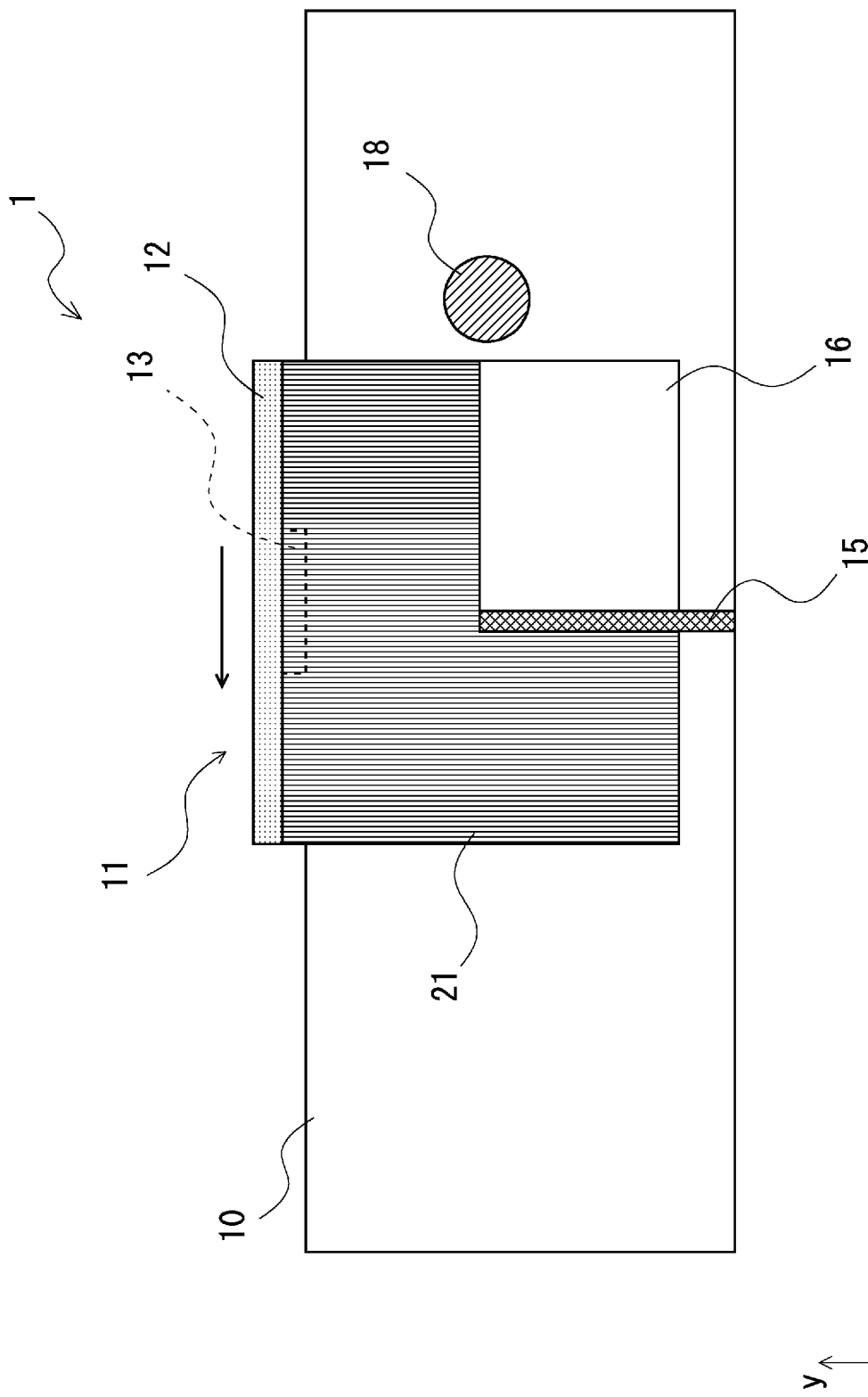
FIG. 7E is a plan view illustrating an operation of the laser irradiation apparatus according to the first embodiment.
Figure 7F:
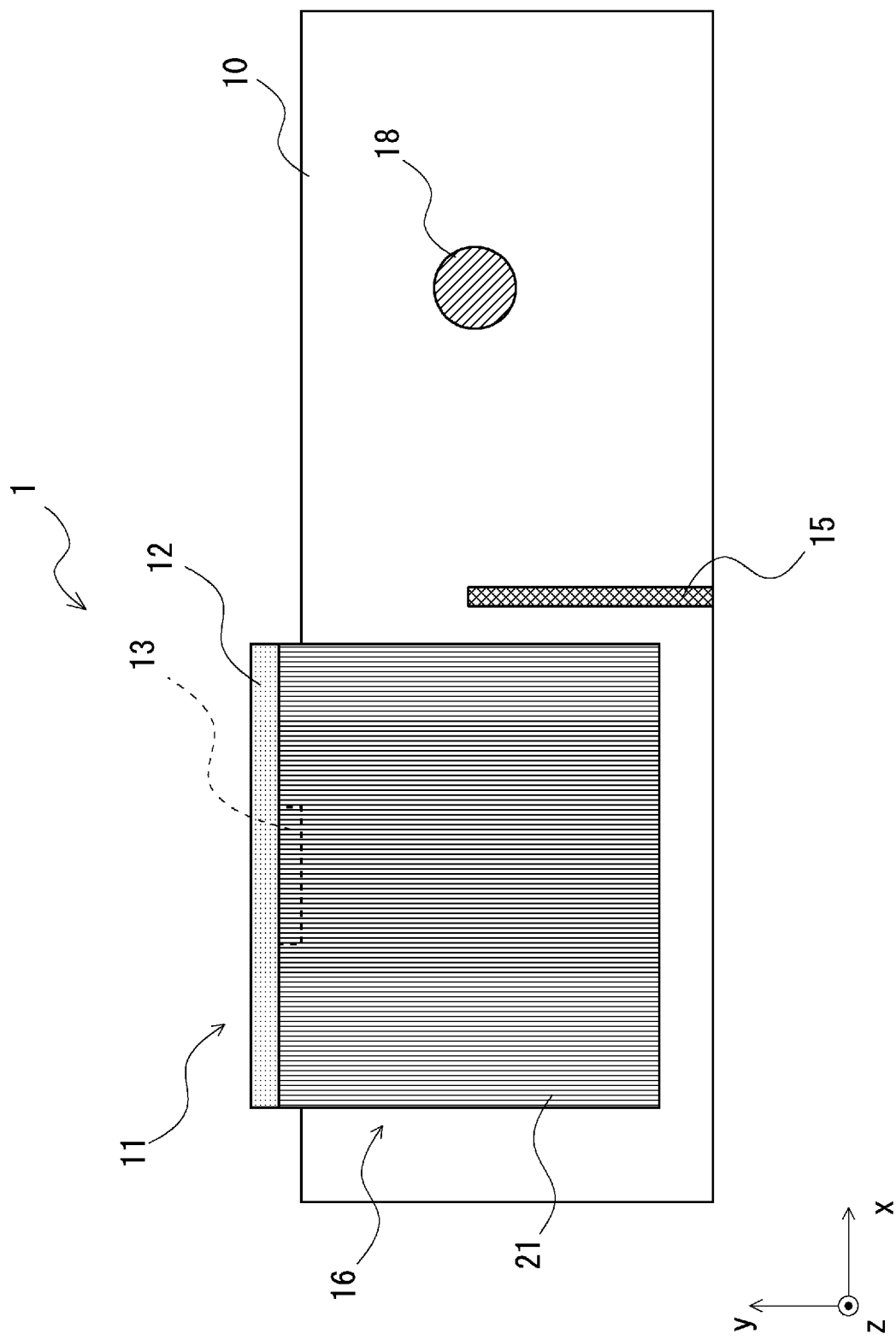
FIG. 7F is a plan view illustrating an operation of the laser irradiation apparatus according to the first embodiment.

Then, as illustrated in FIG. 7E, the moving mechanism 13 of the conveying unit 11 is moved toward the negative side in the x-axis direction with the holding mechanism 12 holding the workpiece 16, and the workpiece 16 is conveyed toward the negative side in the x-axis direction. Thus, the other half of the region on the workpiece 16 is irradiated with the laser beam 15. Then, the workpiece 16 is conveyed to the position as illustrated in FIG. 7F, and thus the entire surface of the workpiece 16 can be irradiated with the laser beam.

In the present embodiment, the operation illustrated in FIGS. 7A to 7F may be repeated a plurality of times. In this manner, repeating the operation illustrated in FIGS. 7A to 7F a plurality of times allows the workpiece 16 to pass through the laser irradiation position 15 a plurality of times and to irradiate a given portion of the workpiece 16 with the laser beam a plurality of times.

In the case of the laser irradiation apparatus 1 described above, as illustrated in FIG. 4, the laser irradiation position 15 is so located as to extend from the negative-side edge portion of the flotation unit 10 in the y-axis direction to the vicinity of the middle portion of the flotation unit 10. In addition, the length of the laser irradiation position 15 in the y-axis direction is approximately one half the length of the flotation unit 10 (workpiece 16) in the y-axis direction.

Figure 8:
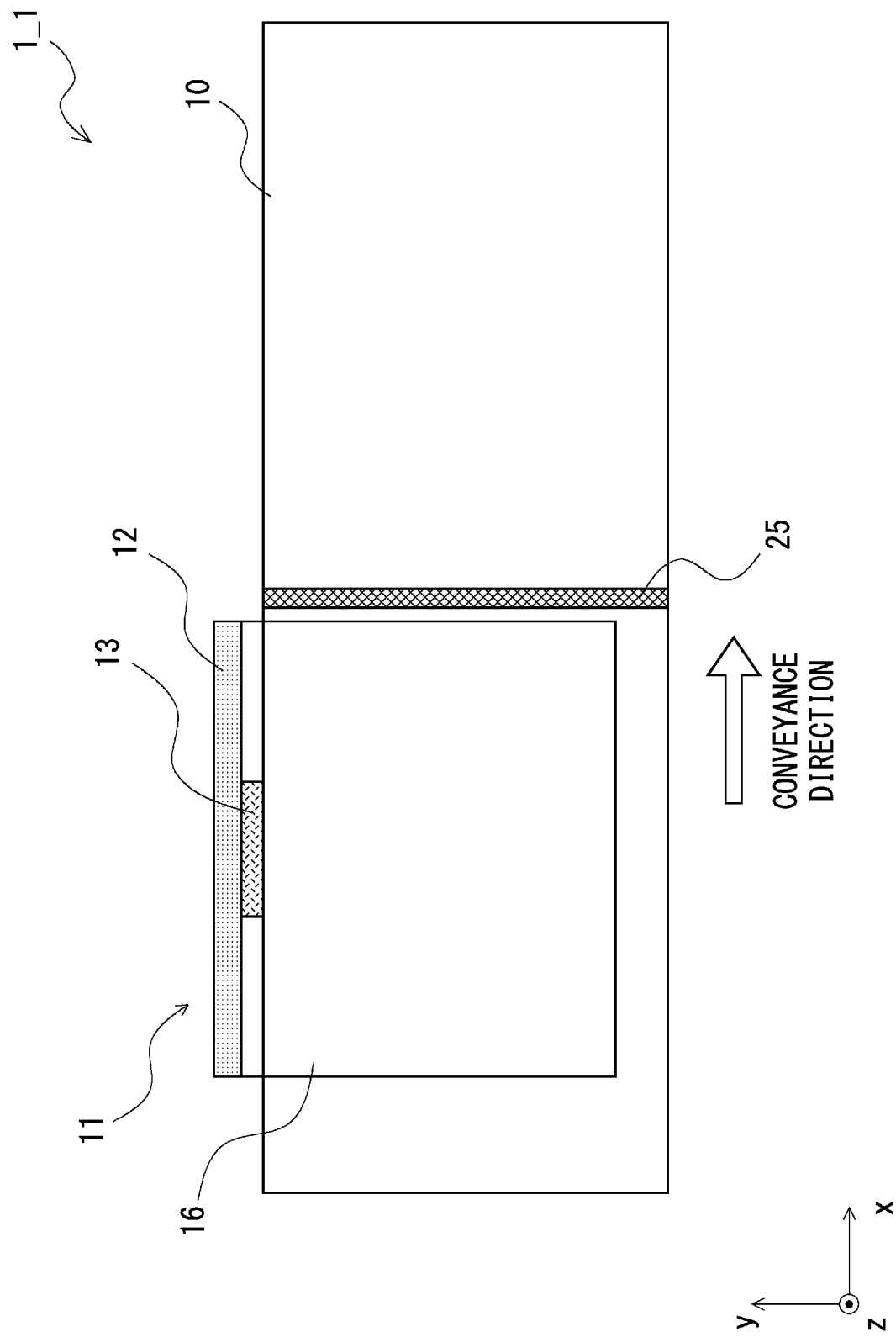
FIG. 8 is a plan view illustrating another configuration example of the laser irradiation apparatus according to the first embodiment.

Alternatively, in the present embodiment, as in a laser irradiation apparatus 1_1 illustrated in FIG. 8, a laser irradiation position 25 may be so located as to extend from the negative-side edge portion to the positive-side edge portion of the flotation unit 10 in the y-axis direction. Such an arrangement of the laser irradiation position 25 makes it possible to increase the area of the laser beam 15 with which the workpiece 16 is irradiated, and the workpiece 16 can be irradiated efficiently with the laser beam 15.

In this case as well, the position (corresponding to the position of the holding mechanism 12) on the workpiece 16 where the workpiece 16 is held by the conveying unit 11 is spaced apart from the laser irradiation position 25. To rephrase, the laser irradiation position 25 is located at a position where there is no influence of deflection that could arise in the workpiece 16 when the conveying unit 11 conveys the workpiece 16.

Figure 9:
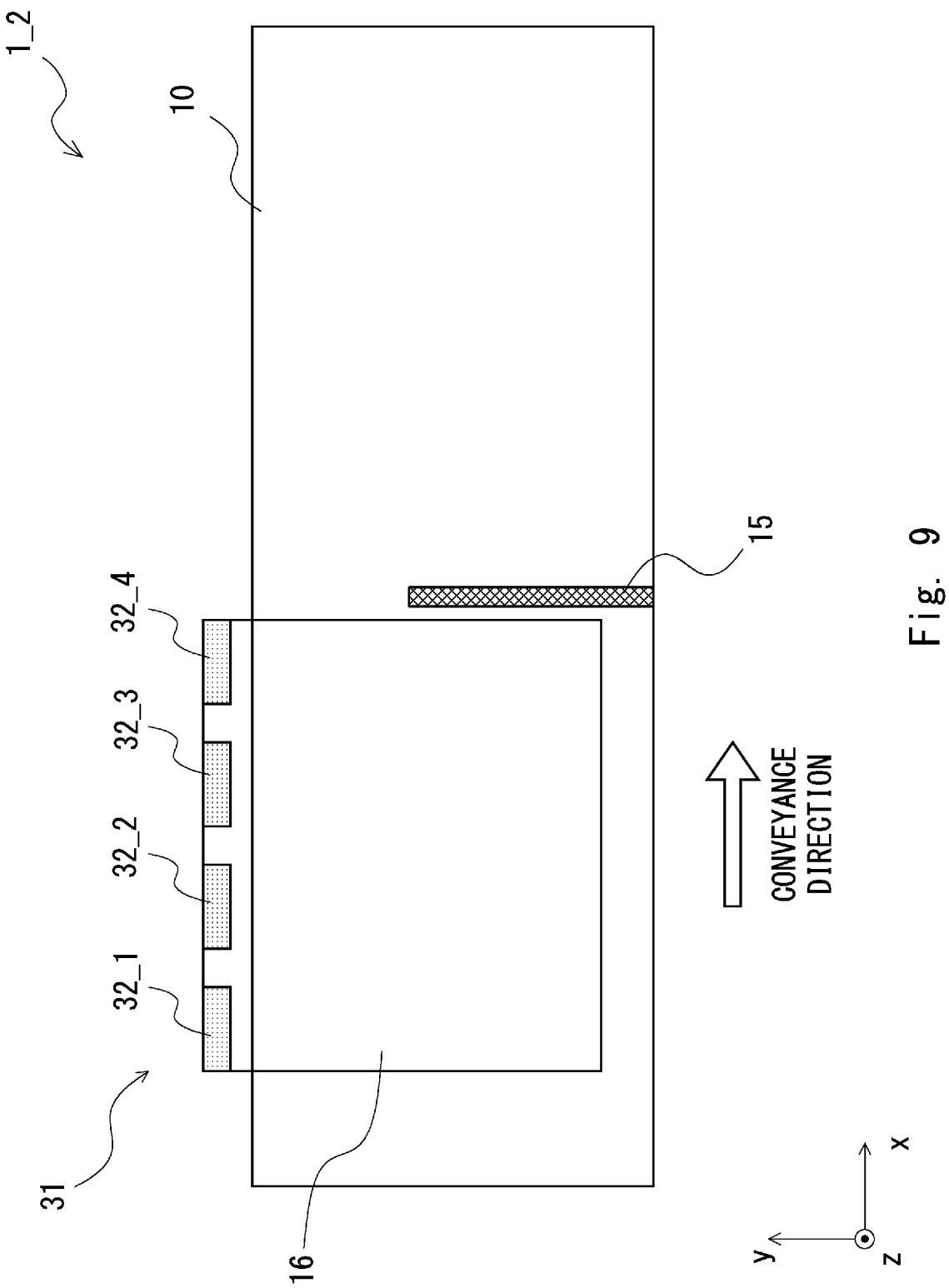
FIG. 9 is a plan view illustrating another configuration example of the laser irradiation apparatus according to the first embodiment.

In the present embodiment, as in a laser irradiation apparatus 1_2 illustrated in FIG. 9, a plurality of holding mechanisms 32_1 to 32_4 may be provided in a conveying unit 31, and an edge portion of the workpiece 16 may be held by each of the holding mechanisms 32_1 to 32_4. In the case illustrated in FIG. 9, the four holding mechanisms 32_1 to 32_4 are spaced apart from each other, and an edge portion of the workpiece 16 is held by these four holding mechanisms 32_1 to 32_4.

Such a configuration makes it possible to reduce the area on the workpiece 16 where the workpiece 16 is held by the holding mechanisms 32_1 to 32_4, that is, the area in which the workpiece 16 is in contact with the holding mechanisms 32_1 to 32_4, and any influence of stress on the workpiece 16 exerted by the holding mechanisms 32_1 to 32_4 can be reduced.

Figure 10:
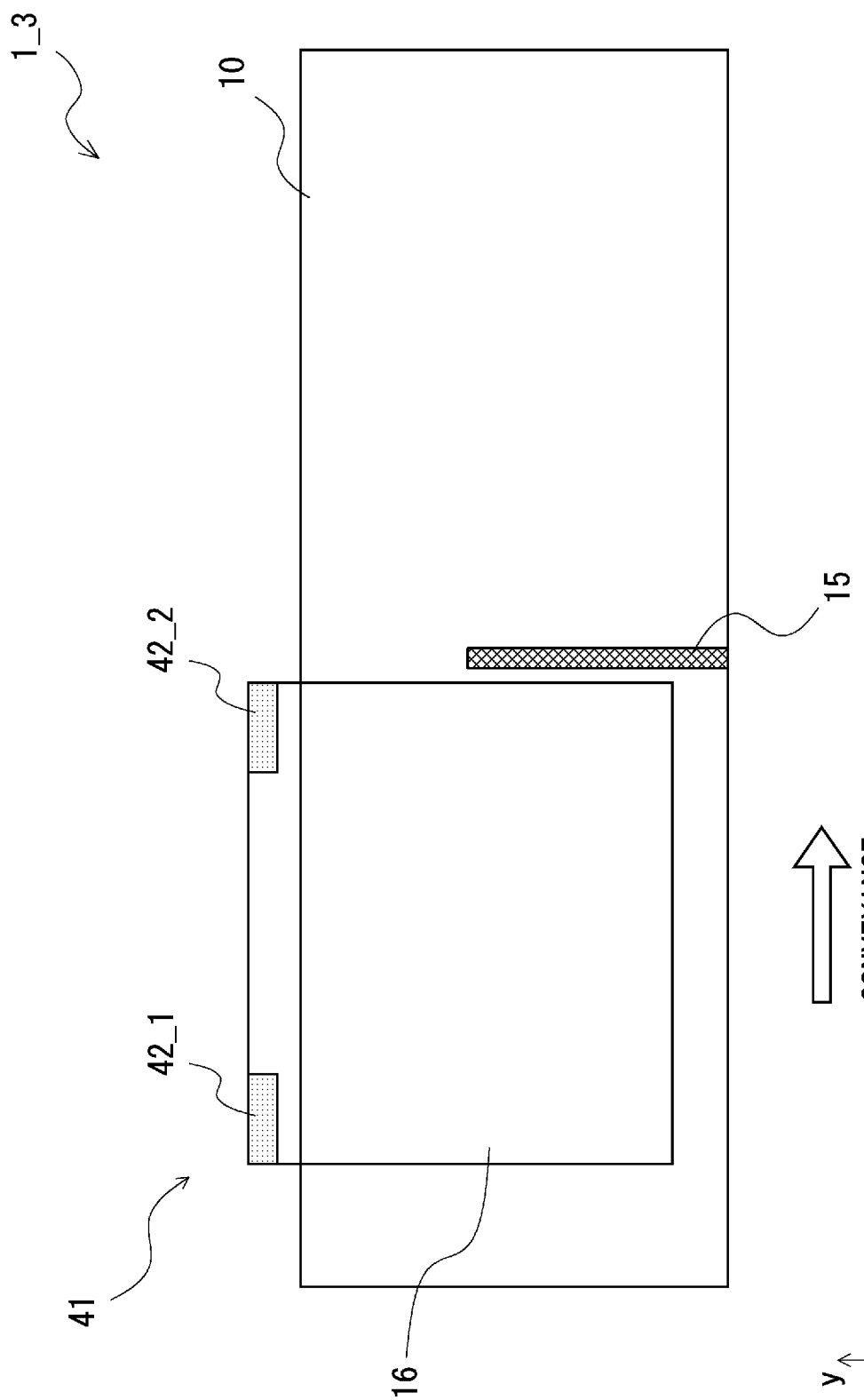
FIG. 10 is a plan view illustrating another configuration example of the laser irradiation apparatus according to the first embodiment.

As in a laser irradiation apparatus 1_3 illustrated in FIG. 10, two holding mechanisms 42_1 and 42_2 may be provided in a conveying unit 41, and an edge portion of the workpiece 16 may be held by each of the holding mechanisms 42_1 and 42_2. In the case illustrated in FIG. 10, the two holding mechanisms 42_1 and 42_2 are spaced apart from each other, the holding mechanism 42_1 holds the upstream side of the workpiece 16 in the conveyance direction, and the holding mechanism 42_2 holds the downstream side of the workpiece 16 in the conveyance direction.

Such a configuration makes it possible to reduce the area on the workpiece 16 where the workpiece 16 is held by the holding mechanisms 42_1 and 42_2, that is, the area in which the workpiece 16 is in contact with the holding mechanisms 42_1 and 42_2, and any influence of stress on the workpiece 16 exerted by the holding mechanisms 42_1 and 42_2 can be reduced.

Figure 11:
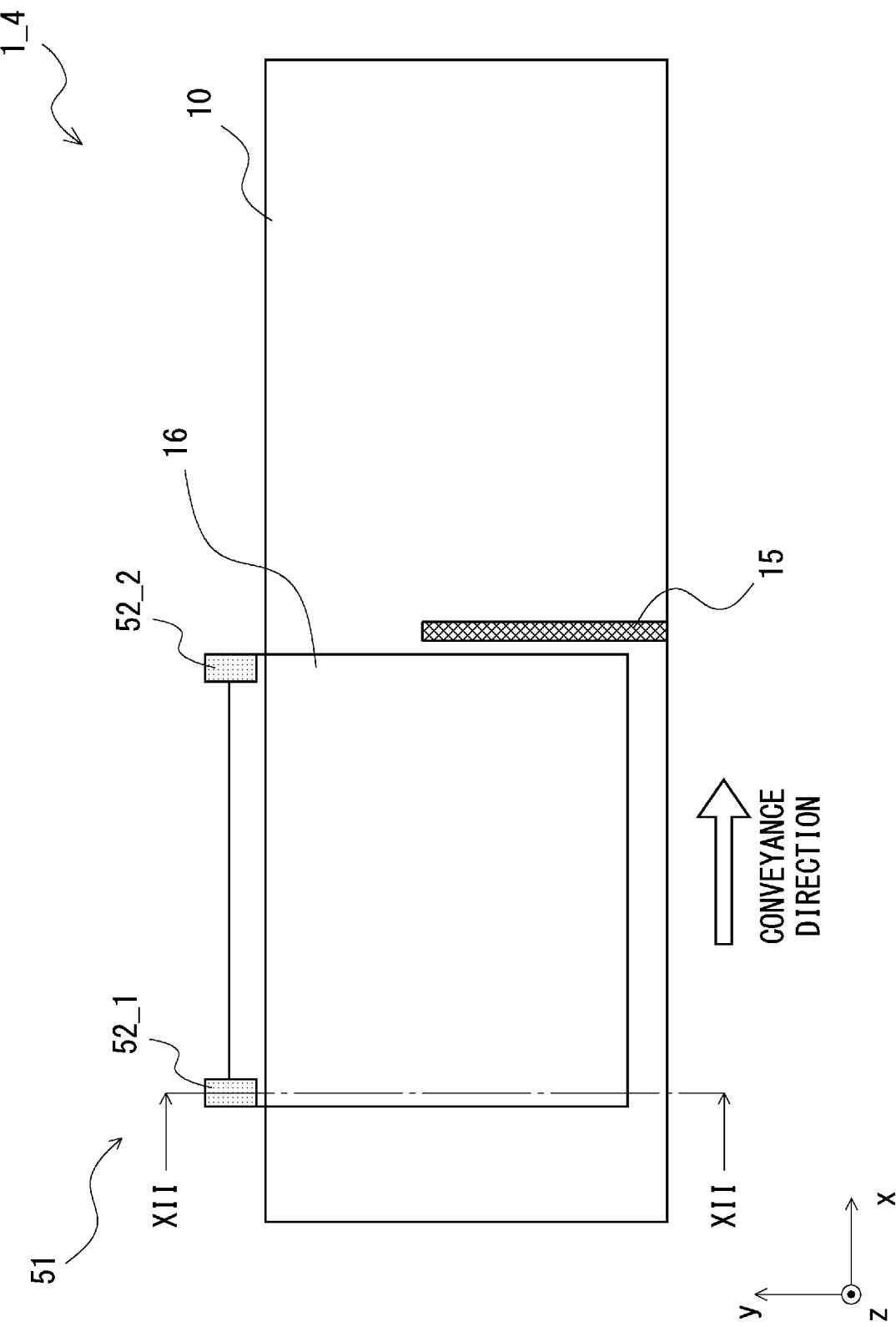
FIG. 11 is a plan view illustrating another configuration example of the laser irradiation apparatus according to the first embodiment.
Figure 12:
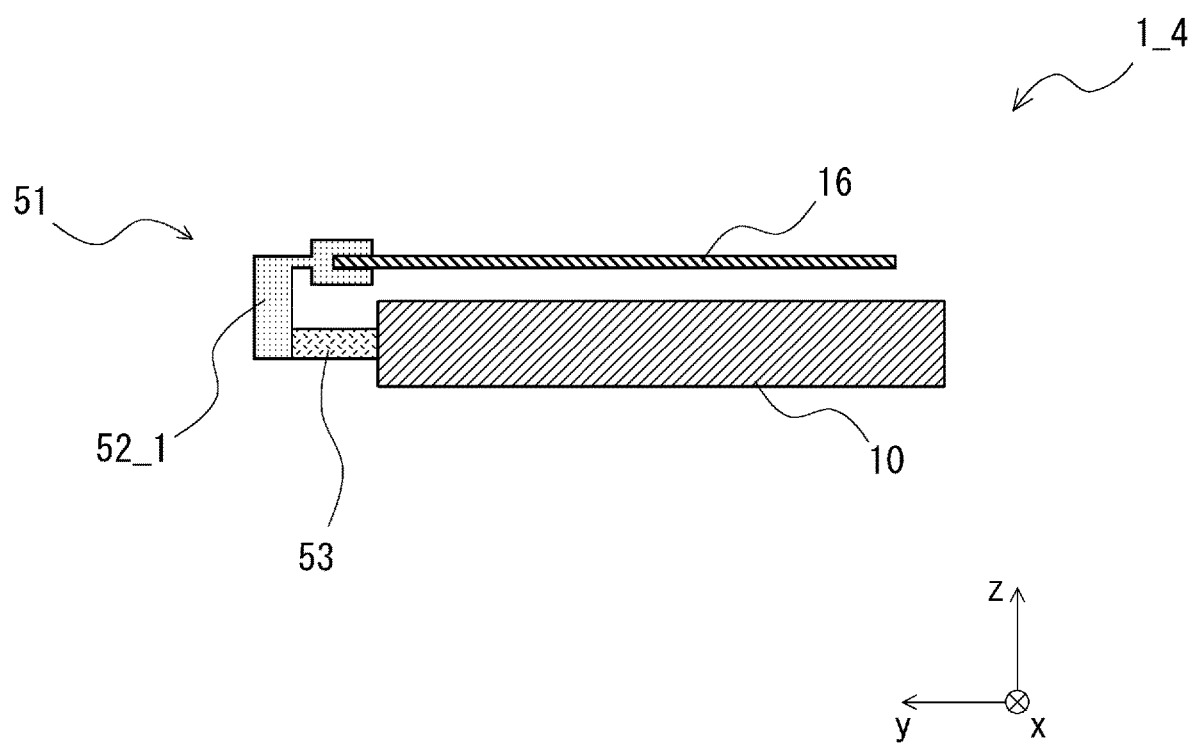
FIG. 12 is a sectional view of the laser irradiation apparatus illustrated in FIG. 11, taken along the cutting-plane line XII-XII.

In the present embodiment, as in a laser irradiation apparatus 1_4 illustrated in FIGS. 11 and 12, holding mechanisms 52_1 and 52_2 of a conveying unit 51 may pinch the workpiece 16 at both sides (upper surface and lower surface). In the example illustrated in FIGS. 11 and 12, the two holding mechanisms 52_1 and 52_2 are spaced apart from each other, the holding mechanism 52_1 pinches the upstream side of the workpiece 16 in the conveyance direction, and the holding mechanism 52_2 pinches the downstream side of the workpiece 16 in the conveyance direction. As illustrated in FIG. 12, the holding mechanisms 52_1 and 52_2 are coupled to a moving mechanism 53, and the holding mechanisms 52_1 and 52_2 convey the workpiece 16 as the moving mechanism 53 moves.

The present embodiment described thus far can provide a laser irradiation apparatus and a laser irradiation method that can suppress uneven irradiation with a laser beam.

Second Embodiment

Next, a second embodiment will be described. FIG. 13 is a plan view for describing a laser irradiation apparatus 2 according to the second embodiment. In the case of the laser irradiation apparatus 2 according to the present embodiment described below, a flotation unit 60 includes four regions 60a to 60d (the rectangular regions each enclosed by solid lines and dashed lines), and a workpiece 66 is conveyed successively through the four regions 60a to 60d to be processed. Other configurations are similar to those of the laser irradiation apparatus 1 described in the first embodiment, and thus duplicate descriptions thereof will be omitted as appropriate.

As illustrated in FIG. 13, the laser irradiation apparatus 2 includes the flotation unit 60 and conveying units 61_1 to 61_4. The flotation unit 60 is configured to eject a gas from a surface of the flotation unit 60. The gas ejected from the surface of the flotation unit 60 is blown against a lower surface of the workpiece 66, and thus the workpiece 66 floats. The flotation unit 60 includes the four regions 60a to 60d.

As illustrated in FIG. 13, the flotation unit 60 is rectangular in shape as viewed in a plan view, and the conveying units 61_1 to 61_4 are so provided as to convey the workpiece 66 along the respective sides of the flotation unit 60. Specifically, the conveying unit 61_1 is provided on one side of the flotation unit 60 that is on the positive side in the y-axis direction and includes a holding mechanism 62_1 and a moving mechanism 63_1. As the moving mechanism 63_1 moves toward the positive side in the x-axis direction with the holding mechanism 62_1 holding the workpiece 66, the workpiece 66 can be conveyed from the region 60a to the region 60b.

The conveying unit 61_2 is provided on one side of the flotation unit 60 that is on the positive side in the x-axis direction and includes a holding mechanism 62_2 and a moving mechanism 63_2. As the moving mechanism 63_2 moves toward the negative side in the y-axis direction with the holding mechanism 62_2 holding the workpiece 66, the workpiece 66 can be conveyed from the region 60b to the region 60c.

The conveying unit 61_3 is provided on one side of the flotation unit 60 that is on the negative side in the y-axis direction and includes a holding mechanism 62_3 and a moving mechanism 63_3. As the moving mechanism 63_3 moves toward the negative side in the x-axis direction with the holding mechanism 62_3 holding the workpiece 66, the workpiece 66 can be conveyed from the region 60c to the region 60d.

The conveying unit 61_4 is provided on one side of the flotation unit 60 that is on the negative side in the x-axis direction and includes a holding mechanism 62_4 and a moving mechanism 63_4. As the moving mechanism 63_4 moves toward the positive side in the y-axis direction with the holding mechanism 62_4 holding the workpiece 66, the workpiece 66 can be conveyed from the region 60d to the region 60a.

In the laser irradiation apparatus 2 illustrated in FIG. 13, a laser irradiation position 65 is located between the region 60a and the region 60b. Thus, the workpiece 66 is irradiated with a laser beam 65 when the workpiece 66 is conveyed from the region 60a to the region 60b.

In the laser irradiation apparatus 2 illustrated in FIG. 13, the length of the laser irradiation position 65 in the y-axis direction is approximately one half the length of the workpiece 66 in the y-axis direction. Thus, a half of the region on the workpiece 66 in the y-axis direction is irradiated with the laser beam while the workpiece 66 is passing through the laser irradiation position 65.

In the laser irradiation apparatus 2 illustrated in FIG. 13, the workpiece 66 is conveyed over the regions 60a, 60b, 60c, and 60d in this order, and the workpiece 66 is irradiated with the laser beam 65 in multiple batches. Thus, the entire surface of the workpiece 66 can be irradiated with the laser beam.

When the entire surface of the workpiece 66 is to be irradiated with the laser beam in this manner, a rotating mechanism 68 that rotates the workpiece 66 by 180 degrees with the rotating mechanism 68 holding a horizontal surface (in the xy-plane) of the workpiece 66 is provided in the region 60d of the flotation unit 60, as illustrated in FIG. 13. Specifically, the workpiece 66 is conveyed from the region 60a to the region 60b with the use of the conveying unit 61_1, and the workpiece 66 is irradiated with the laser beam 65. Thereafter, the workpiece 66 is conveyed with the use of the conveying units 61_2 to 61_4, and the workpiece is rotated by 180 degrees by the rotating mechanism 68. Then, the workpiece 66 is conveyed again from the region 60a to the region 60b with the use of the conveying unit 61_1, and the workpiece 66 is irradiated with the laser beam 65. Thus, the entire surface of the workpiece 66 can be irradiated with the laser beam 65. This operation will be described in detail below with reference to FIGS. 14A to 14J.

Figure 14B:
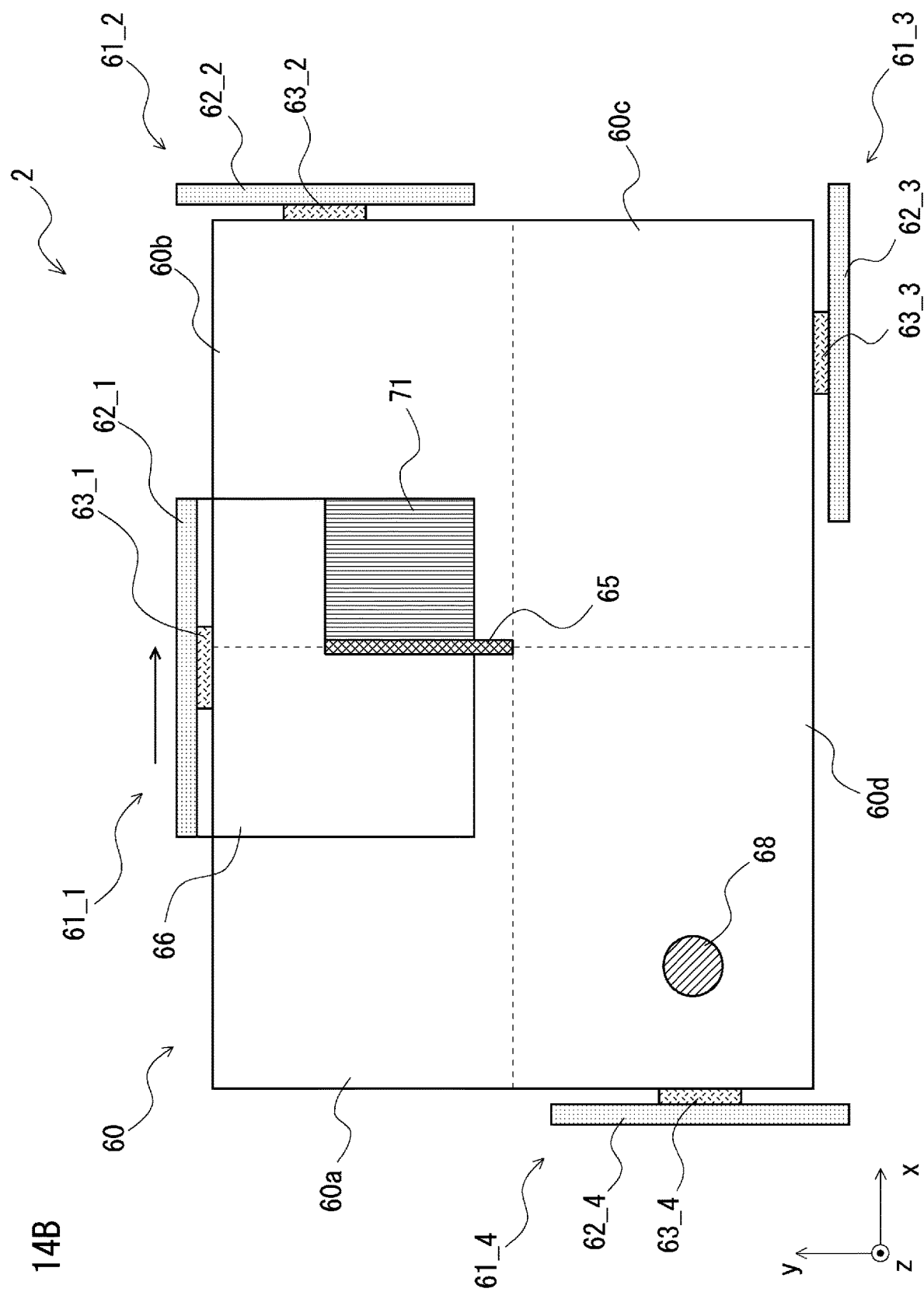
FIG. 14B is a plan view illustrating an operation of the laser irradiation apparatus according to the second embodiment.

When the workpiece 66 is to be irradiated with the laser beam 65 with the use of the laser irradiation apparatus 2, first, as illustrated in FIG. 14A, the lower surface of the edge portion of the workpiece 66 in the y-axis direction is held by the holding mechanism 62_1 of the conveying unit 61_1. Thereafter, as illustrated in FIG. 14B, the moving mechanism 63_1 of the conveying unit 61_1 is moved toward the positive side in the x-axis direction with the holding mechanism 62_1 holding the workpiece 66, and the workpiece 66 is conveyed toward the positive side in the x-axis direction. Thus, a half of the region on the workpiece 66 is irradiated with the laser beam 65 (the region having been irradiated with the laser beam is indicated by the reference numeral 71).

Figure 14C:
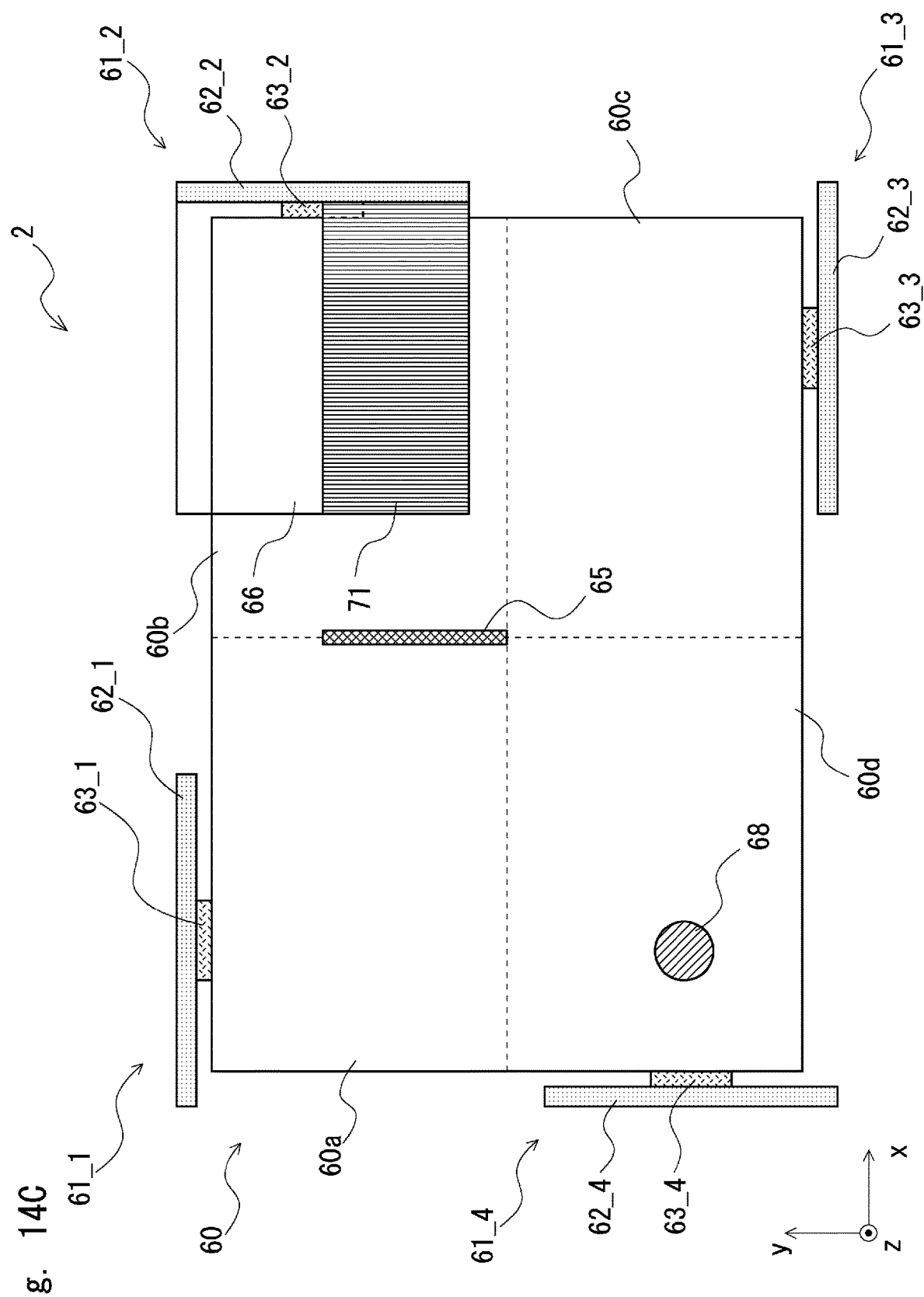
FIG. 14C is a plan view illustrating an operation of the laser irradiation apparatus according to the second embodiment.

As illustrated in FIG. 14C, upon the workpiece 66 reaching the region 60b of the flotation unit 60, the holding mechanism that holds the workpiece 66 is changed from the holding mechanism 62_1 to the holding mechanism 62_2. In addition, the conveying unit 61_1 is restored to its original position (region 60a).

Figure 14D:
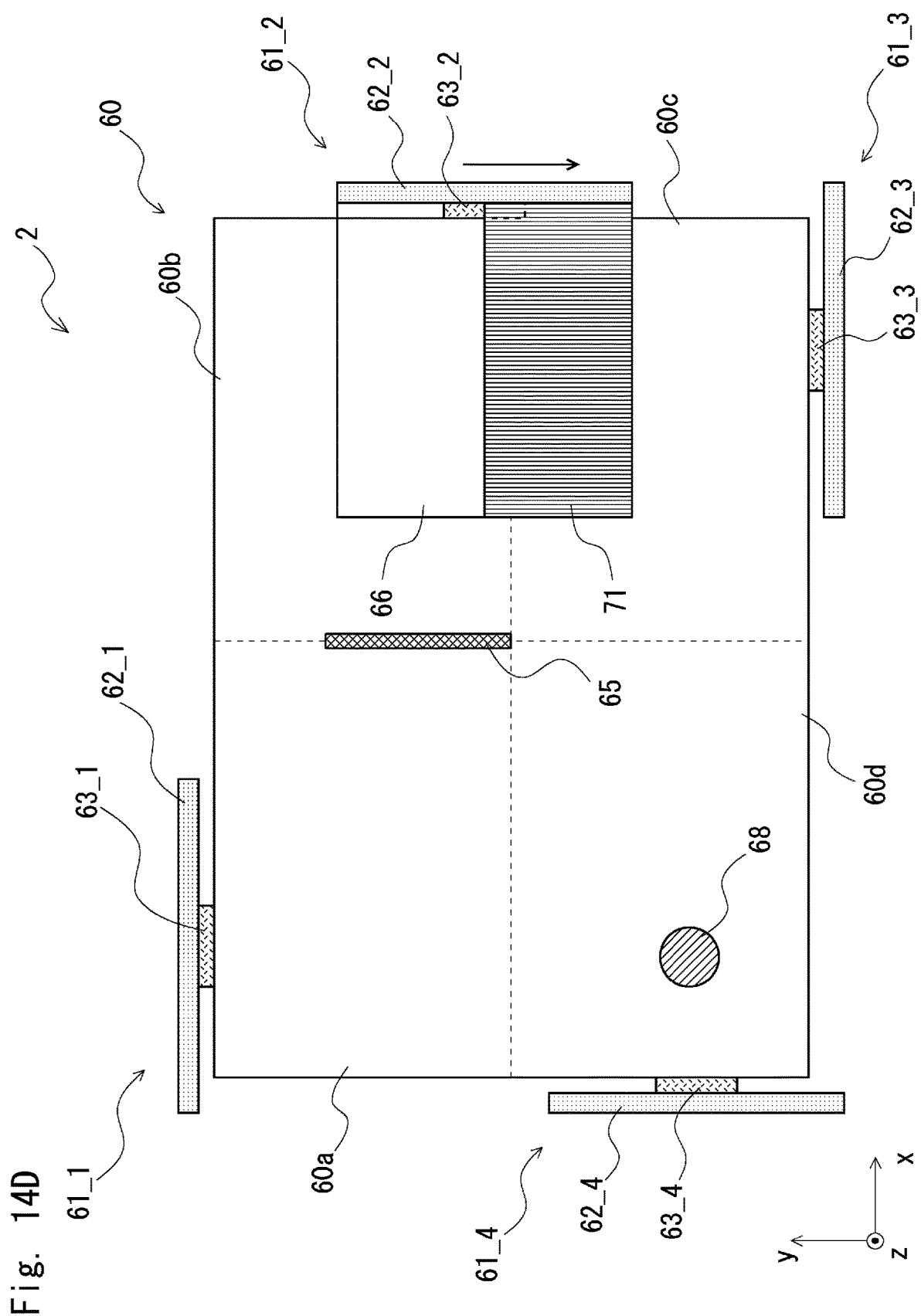
FIG. 14D is a plan view illustrating an operation of the laser irradiation apparatus according to the second embodiment.

Thereafter, as illustrated in FIG. 14D, the moving mechanism 63_2 of the conveying unit 61_2 is moved toward the negative side in the y-axis direction with the holding mechanism 62_2 holding the workpiece 66, and the workpiece 66 is conveyed toward the negative side in the y-axis direction.

Figure 14E:
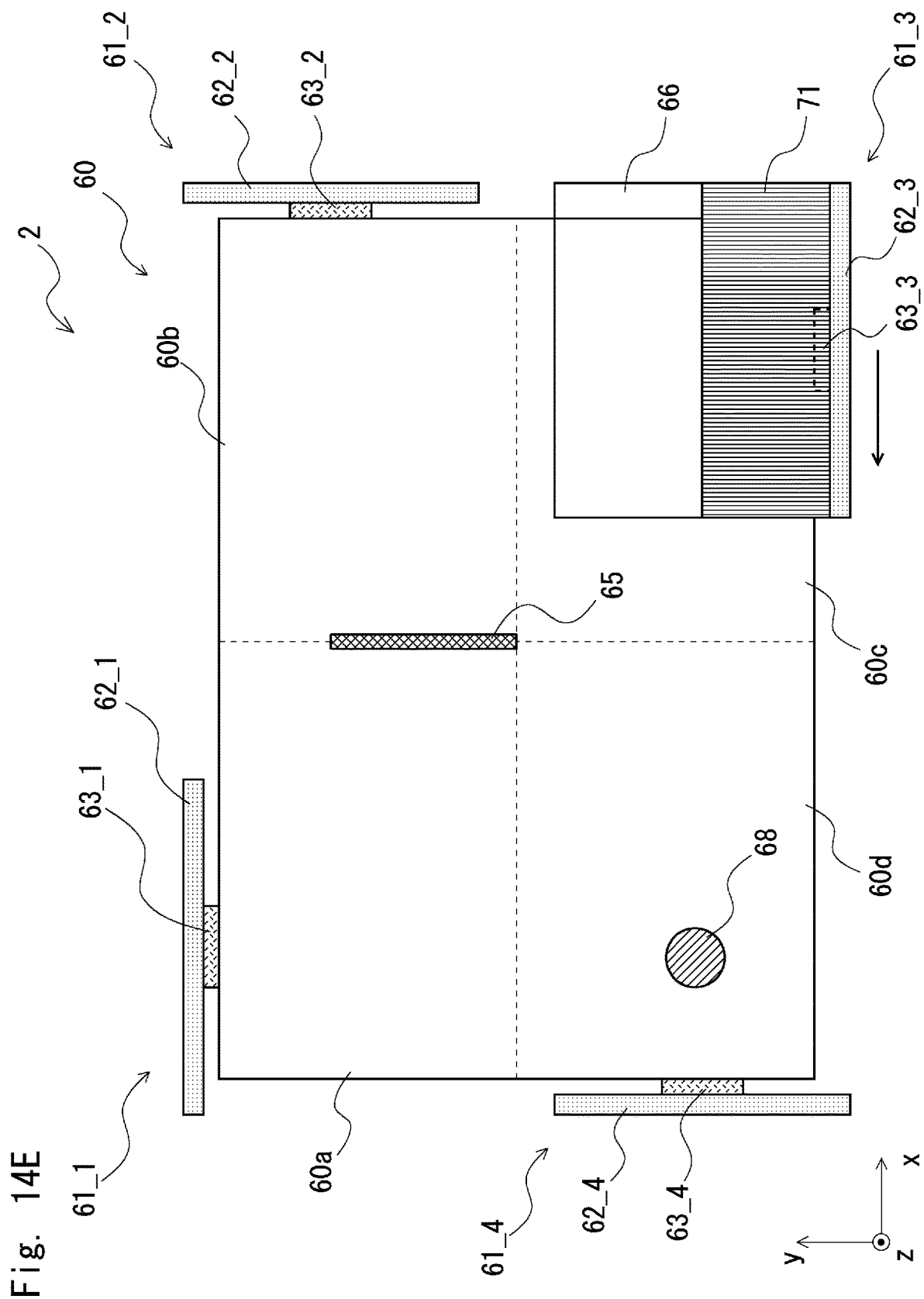
FIG. 14E is a plan view illustrating an operation of the laser irradiation apparatus according to the second embodiment.

As illustrated in FIG. 14E, upon the workpiece 66 reaching the region 60c of the flotation unit 60, the holding mechanism that holds the workpiece 66 is changed from the holding mechanism 62_2 to the holding mechanism 62_3. In addition, the conveying unit 61_2 is restored to its original position (region 60b). Thereafter, the moving mechanism 63_3 of the conveying unit 61_3 is moved toward the negative side in the x-axis direction with the holding mechanism 62_3 holding the workpiece 66, and the workpiece 66 is conveyed toward the negative side in the x-axis direction.

Figure 14F:
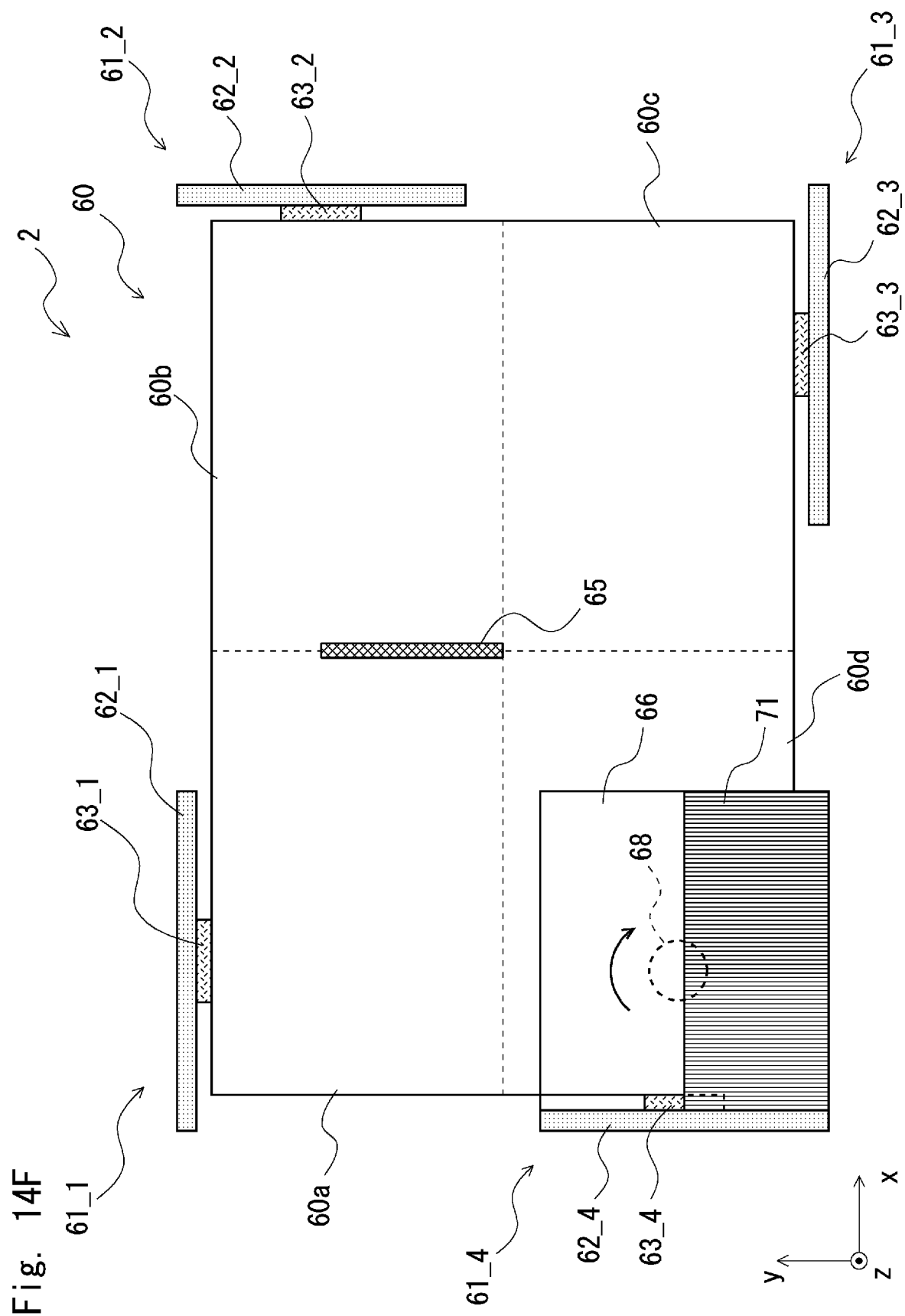
FIG. 14F is a plan view illustrating an operation of the laser irradiation apparatus according to the second embodiment.

Then, as illustrated in FIG. 14F, the workpiece 66 is conveyed to the region 60d of the flotation unit 60. Upon the workpiece 66 reaching a position over the rotating mechanism 68, the holding state of the holding mechanism 62_3 is released to provide a state in which the holding mechanism 62_3 is not holding the workpiece 66. After the holding mechanism 62_3 has released the workpiece 66, the conveying unit 61_3 is restored to its original position (region 60c).

Figure 14G:
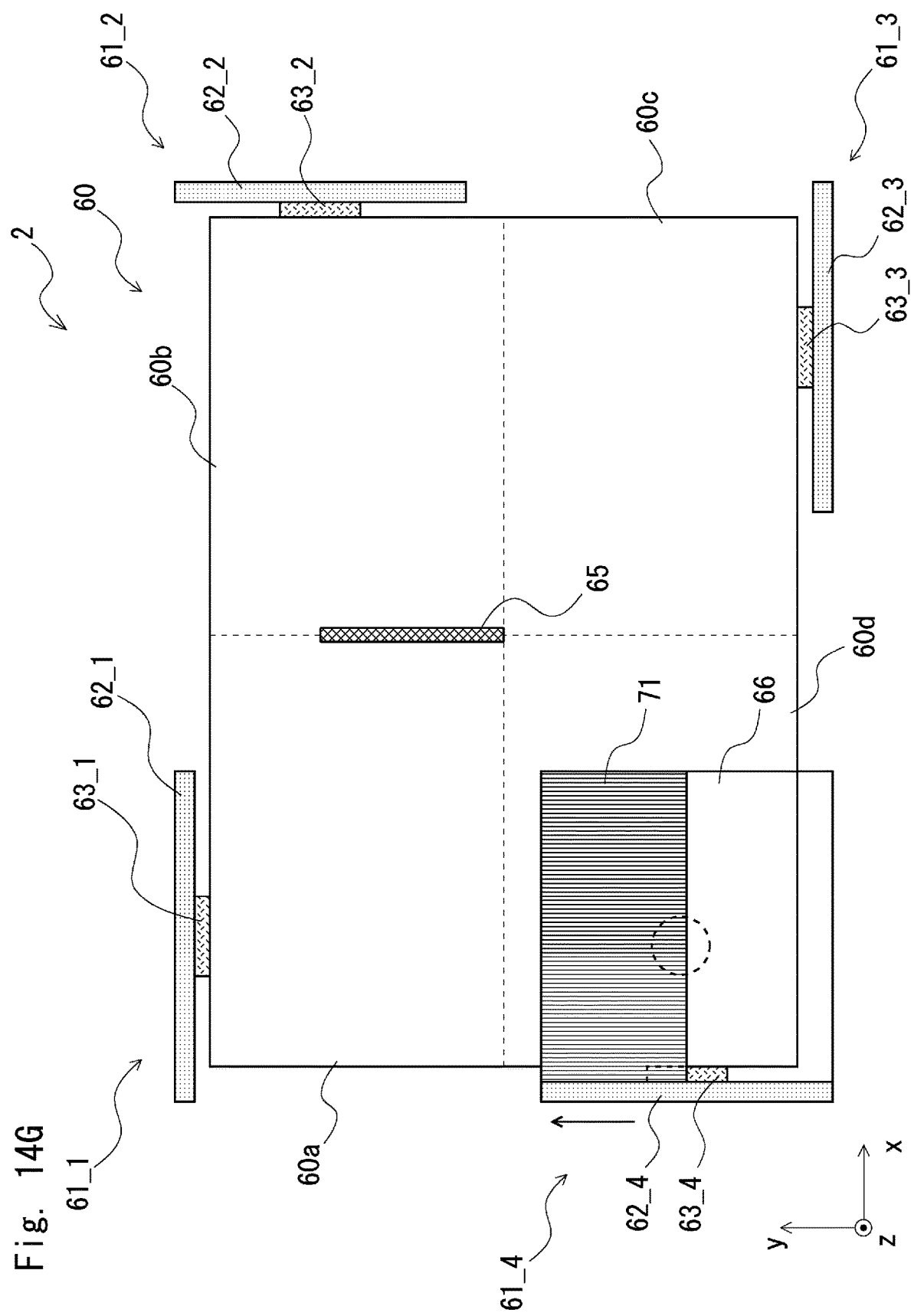
FIG. 14G is a plan view illustrating an operation of the laser irradiation apparatus according to the second embodiment.

While the workpiece 66 is being placed on the rotating mechanism 68, the rotating mechanism 68 is rotated by 180 degrees. This allows the workpiece 66 to be rotated by 180 degrees, and the region 71 on the workpiece 66 that has been irradiated with the laser beam is relocated from the negative side in the y-axis direction to the positive side in the y-axis direction, as illustrated in FIG. 14G. Thereafter, the workpiece 66 is held by the holding mechanism 62_4. Then, the moving mechanism 63_4 of the conveying unit 61_4 is moved toward the positive side in the y-axis direction with the holding mechanism 62_4 holding the workpiece 66, and the workpiece 66 is conveyed toward the positive side in the y-axis direction.

Figure 14H:
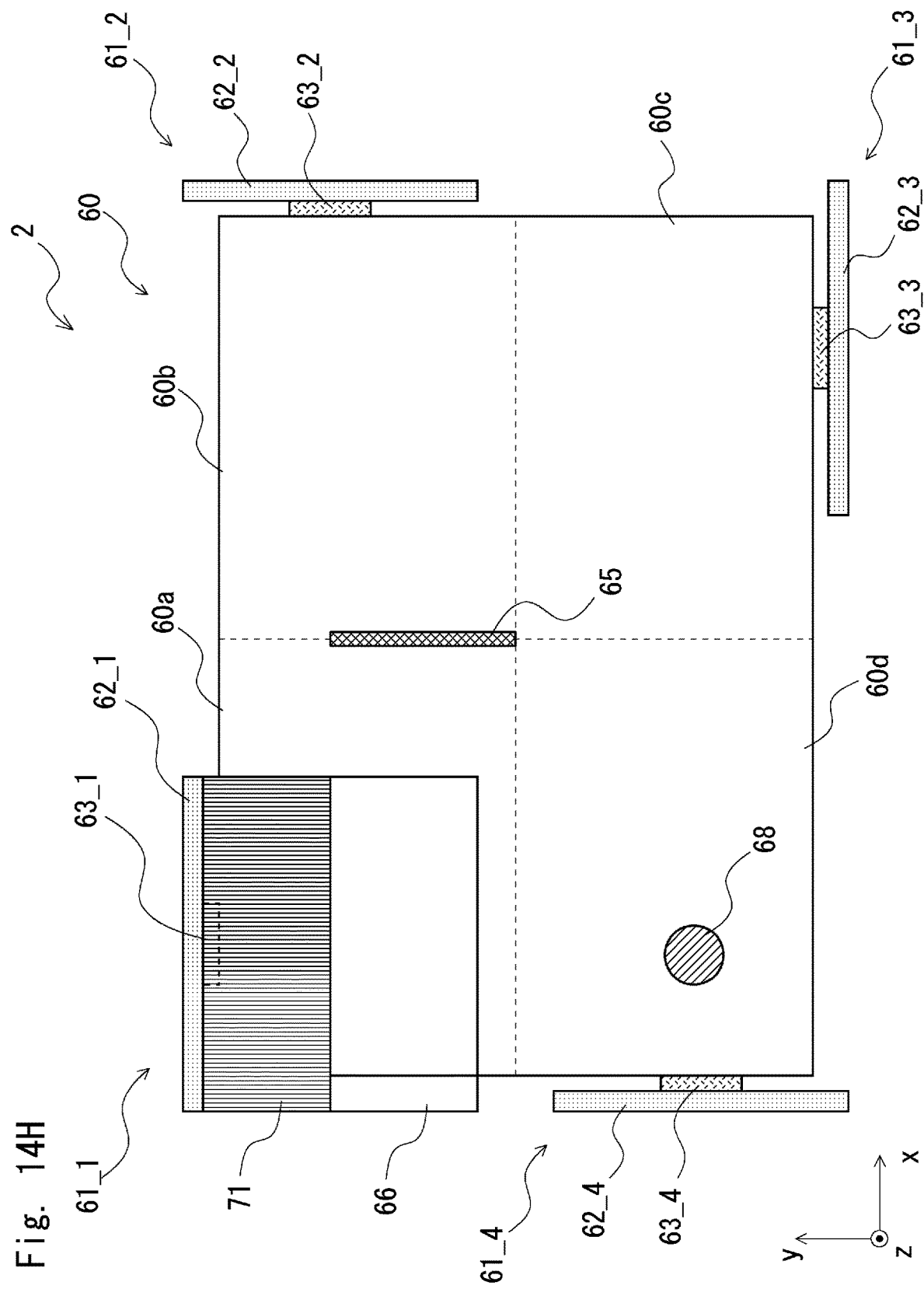
FIG. 14H is a plan view illustrating an operation of the laser irradiation apparatus according to the second embodiment.

As illustrated in FIG. 14H, upon the workpiece 66 reaching the region 60a of the flotation unit 60, the holding mechanism that holds the workpiece 66 is changed from the holding mechanism 62_4 to the holding mechanism 62_1. In addition, the conveying unit 61_4 is restored to its original position (region 60d).

Thereafter, as illustrated in FIG. 14I, the moving mechanism 63_1 of the conveying unit 61_1 is moved toward the positive side in the x-axis direction with the holding mechanism 62_1 holding the workpiece 66, and the workpiece 66 is conveyed toward the positive side in the x-axis direction. Thus, the other half of the region on the workpiece 66 is irradiated with the laser beam 65 (the region having been irradiated with the laser beam is indicated by the reference numeral 71).

Then, as illustrated in FIG. 14J, the workpiece 66 is conveyed to the region 60b, and thus the entire surface of the workpiece 66 can be irradiated with the laser beam.

In the present embodiment, the operation illustrated in FIGS. 14A to 14J may be repeated a plurality of times. In this manner, repeating the operation illustrated in FIGS. 14A to 14J a plurality of times allows the workpiece 66 to pass through the laser irradiation position 65 a plurality of times and to irradiate a given portion of the workpiece 66 with the laser beam a plurality of times.

In the case of the laser irradiation apparatus 2 described above, the rotating mechanism 68 is provided in the region 60d of the flotation unit 60. Alternatively, the rotating mechanism 68 may be provided at a location other than the region 60d of the flotation unit 60 in the present embodiment. In other words, it suffices that the workpiece 66 be rotated by 180 degrees after having passed through the laser irradiation position 65 and before passing through the laser irradiation position 65 again, and thus the location where the rotating mechanism 68 is provided may be in any one of the regions 60a to 60d.

In the laser irradiation apparatus 2 according to the present embodiment, the workpiece 66 is conveyed over the regions 60a, 60b, 60c, and 60d in this order, and the workpiece 66 is irradiated with the laser beam 65. Thus, a plurality of workpieces can be conveyed simultaneously in a circulating manner.

In other words, in the laser irradiation apparatus 2 according to the present embodiment, while the workpiece 66 is being irradiated with the laser beam 65, another workpiece can be conveyed, the rotating mechanism 68 can be rotated, or the laser irradiation apparatus 2 can be loaded or unloaded with another workpiece. Therefore, immediately upon the workpiece 66 having been irradiated with the laser beam 65, another workpiece can be irradiated with the laser beam 65, and thus the duration in which no workpiece is being irradiated with the laser beam 65 can be reduced. In other words, according to the present embodiment, the throughput of the laser irradiation apparatus 2 can be improved. In this case, it is preferable to provide the rotating mechanism 68 in a region other than the regions 60a and 60b, and the rotating mechanism 68 is provided preferably in the region 60d, for example.

In the configuration illustrated in FIG. 13, the workpiece 66 is irradiated with the laser beam 65 while the workpiece 66 is being conveyed with the use of the conveying unit 61_1. Thus, another workpiece cannot be irradiated with the laser beam 65 until the conveying unit 61_1 that has moved to the region 60b returns to the region 60a. However, for example, by providing, aside from the conveying unit 61_1, another conveying unit that conveys the workpiece 66 from the region 60a to the region 60b and by conveying workpieces 66 in an alternating manner with the use of the plurality of conveying units, even in the duration in which the conveying unit 61_1 returns from the region 60b to the region 60a, another workpiece can be irradiated with the laser beam 65 with the use of the other conveying unit. According, the throughput of the laser irradiation apparatus 2 can be further improved.

As described thus far, in the present embodiment as well, the conveying units 61_1 to 61_4 hold the workpiece 16 at positions (corresponding to the positions of the holding mechanisms 62_1 to 62_4) that do not overlap the laser irradiation position 65. Such a configuration allows the laser irradiation position 65 and the positions on the workpiece 66 where the workpiece 66 is held by the conveying units 61_1 to 61_4 to be spaced apart from each other, and any influence of deflection of the workpiece 66 that could arise as stress is propagated to the workpiece 66 from the conveying units 61_1 to 61_4 while the workpiece 66 is being conveyed can be reduced. In other words, any influence of deflection of the workpiece 66 during laser irradiation can be reduced.

Accordingly, a laser irradiation apparatus that can suppress uneven irradiation with a laser beam can be provided.

OTHER EMBODIMENTS

Next, as another embodiment, a method of manufacturing a semiconductor device with the use of the laser irradiation apparatus described above will be described. In the present embodiment, a laser annealing apparatus is used as the laser irradiation apparatus, and thus an amorphous film formed on a substrate can be irradiated with a laser beam to crystallize the amorphous film. For example, the semiconductor device is provided with a TFT (Thin Film transistor). In this case, an amorphous silicon film is irradiated with a laser beam and crystallized, and a polysilicon film can thus be formed.

(Method of Manufacturing Semiconductor Device)

Figure 15:
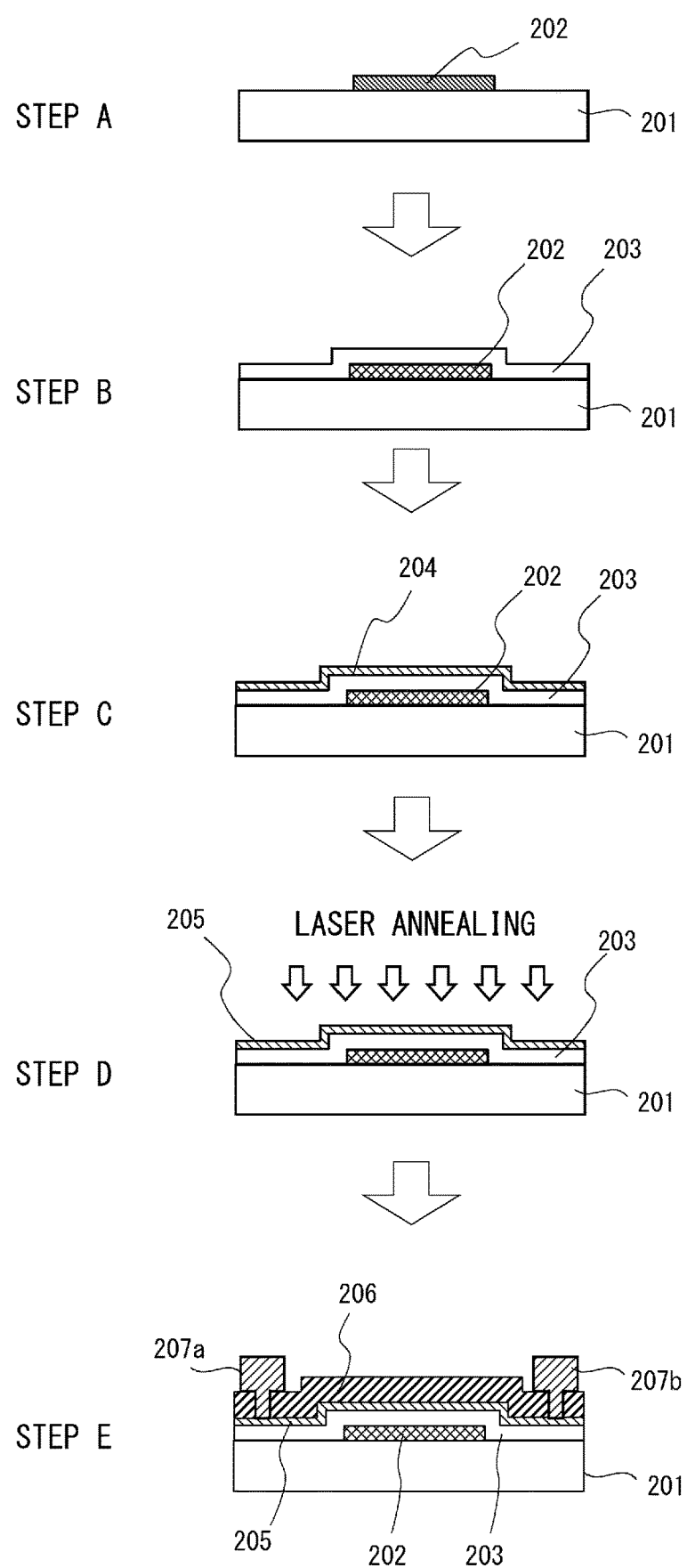
FIG. 15 is a sectional view for describing a method of manufacturing a semiconductor device.

FIG. 15 is a sectional view for describing an example of a method of manufacturing a semiconductor device. The laser irradiation apparatus according to the present embodiment described above is suitable for manufacturing a TFT array substrate. Hereinafter, a method of manufacturing a semiconductor device having a TFT will be described.

First, as illustrated in step A in FIG. 15, a gate electrode 202 is formed on a glass substrate 201. A metal thin film including aluminum or the like can be used for the gate electrode 202, for example. Then, as illustrated in step B in FIG. 15, a gate insulating film 203 is formed on the gate electrode 202. The gate insulating film 203 is formed so as to cover the gate electrode 202. Thereafter, as illustrated in step C in FIG. 15, an amorphous silicon film 204 is formed on the gate insulating film 203. The amorphous silicon film 204 is disposed so as to overlap the gate electrode 202 with the gate insulating film 203 interposed therebetween.

The gate insulating film 203 is a silicon nitride film ($SiN_x$), a silicon oxide film ($SiO_2$ film), a layered film of these, or the like. Specifically, the gate insulating film 203 and the amorphous silicon film 204 are deposited consecutively through a CVD (Chemical Vapor Deposition) technique.

Then, as illustrated in step D in FIG. 15, the amorphous silicon film 204 is irradiated with a laser beam with the use of the laser irradiation apparatus described above to crystallize the amorphous silicon film 204, and a polysilicon film 205 is thus formed. With this process, the polysilicon film 205 in which silicon is crystallized is formed on the gate insulating film 203.

At this point, using the laser irradiation apparatus according to the present embodiment described above makes it possible to reduce any influence of deflection of the substrate 201 during laser irradiation, and the amorphous silicon film 204 can be kept from being out of the depth of focus (DOF) of the irradiating laser beam. Accordingly, the polysilicon film 205 that is uniformly crystallized can be formed.

Thereafter, as illustrated in step E in FIG. 15, an interlayer insulating film 206, a source electrode 207a, and a drain electrode 207b are formed on the polysilicon film 205. The interlayer insulating film 206, the source electrode 207a, and the drain electrode 207b can be formed with a typical photolithography technique or film forming technique.

With the use of the method of manufacturing a semiconductor device described above, a semiconductor device provided with a TFT can be manufactured. Manufacturing processes thereafter differ among different devices to be manufactured in the end, and thus descriptions thereof will be omitted.

(Organic EL Display)

Figure 16:
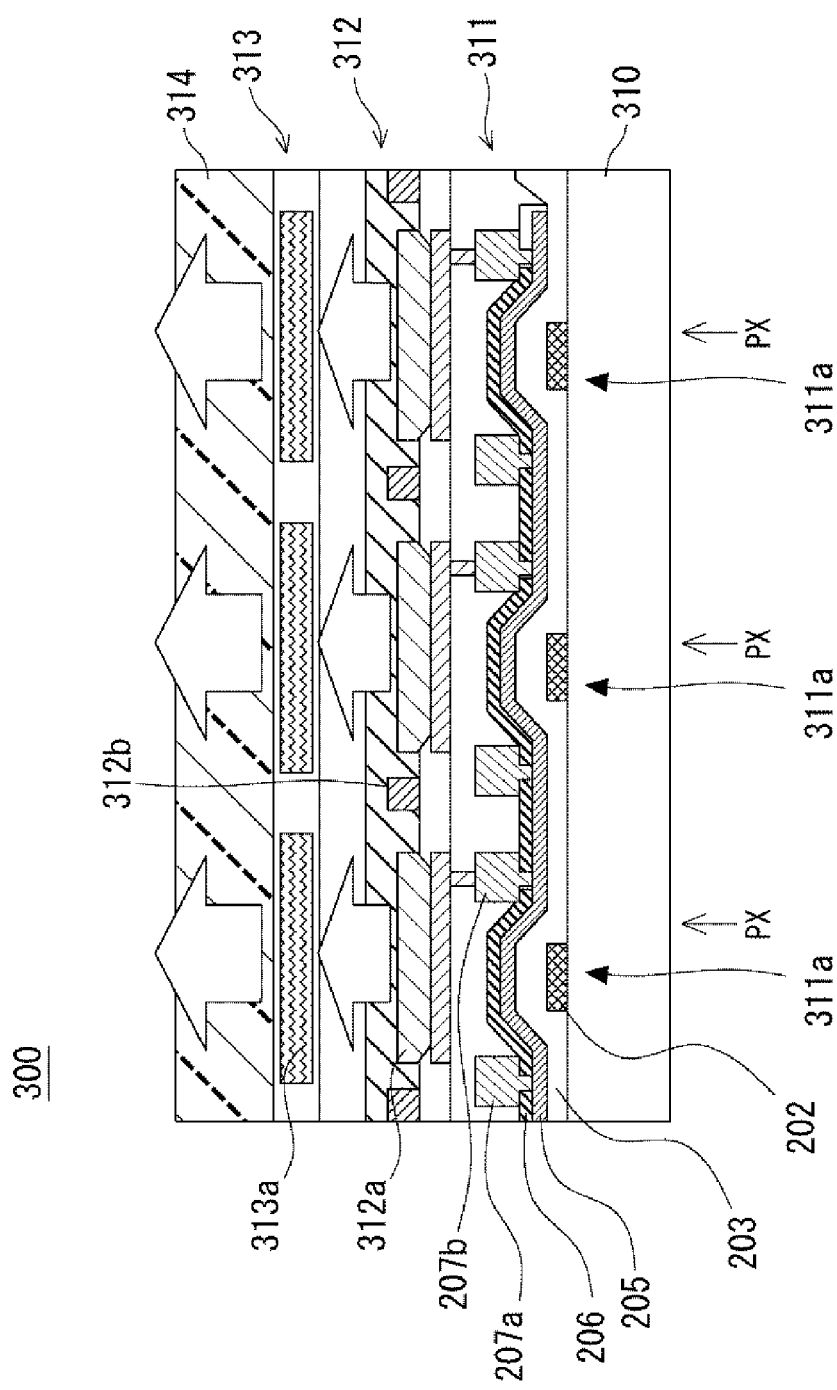
FIG. 16 is a sectional view for describing an overview of an organic EL display.

Next, an organic EL display will be described as an example of a device in which a semiconductor device provided with a TFT is used. FIG. 16 is a sectional view for describing an overview of the organic EL display, and a pixel circuit of the organic EL display is illustrated in a simplified manner. An organic EL display 300 illustrated in FIG. 16 is an active-matrix display apparatus in which a TFT is disposed in each pixel PX.

The organic EL display 300 includes a substrate 310, a TFT layer 311, an organic layer 312, a color filter layer 313, and a sealing substrate 314. FIG. 16 illustrates an organic EL display of a top-emission system in which the sealing substrate 314 is located on a viewing side. The following description illustrates one configuration example of the organic EL display, and the present embodiment is not limited to the configuration described below. For example, the semiconductor device according to the present embodiment may be used in an organic EL display of a bottom-emission system.

The substrate 310 is a glass substrate or a metal substrate. The TFT layer 311 is provided on the substrate 310. The TFT layer 311 includes a TFT 311a disposed in each pixel PX. The TFT layer 311 further includes a wire and so on to be coupled to the TFT 311a. The TFT 311a, the wire, and so on constitute a pixel circuit. The TFT layer 311 corresponds to the TFT illustrated in FIG. 15 and includes the gate electrode 202, the gate insulating film 203, the polysilicon film 205, the interlayer insulating film 206, the source electrode 207a, and the drain electrode 207b.

The organic layer 312 is provided on the TFT layer 311. The organic layer 312 includes an organic EL light-emitting element 312a disposed in each pixel PX. The organic EL light-emitting element 312a has a layered structure in which, for example, an anode, a hole injection layer, a hole transport layer, a light-emitting layer, an electron transport layer, an electron injection layer, and a cathode are stacked. In the case of the top-emission system, the anode is a metal electrode, and the cathode is a transparent conductive film of ITO (Indium Tin Oxide) or the like. The organic layer 312 is further provided with a partition wall 312b for separating each organic EL light-emitting element 312a between the pixels PX.

The color filter layer 313 is provided on the organic layer 312. The color filter layer 313 is provided with a color filter 313a for providing color display. Specifically, a resin layer colored in R (red), G (green), or B (blue) is provided in each pixel PX as a color filter 313a. White light emitted from the organic layer 312 is converted into RGB color light upon passing through the color filter 313a. In a case of a three-color system in which organic EL light-emitting elements that emit light in RGB colors are provided in the organic layer 312, the color filter layer 313 may be omitted.

The sealing substrate 314 is provided on the color filter layer 313. The sealing substrate 314 is a transparent substrate, such as a glass substrate, and is provided so as to prevent degradation of the organic EL light-emitting elements in the organic layer 312.

A current that flows in the organic EL light-emitting elements 312a of the organic layer 312 varies with a display signal supplied to the pixel circuits. Therefore, the emission amount of each pixel PX can be controlled by supplying a display signal corresponding to a display image to each pixel PX. Thus, a desired image can be displayed.

In the foregoing, the organic EL display has been described as an example of the device in which a semiconductor device provided with a TFT is used. Alternatively, the semiconductor device provided with a TFT may be a liquid-crystal display, for example. In the case described above, the laser irradiation apparatus according to the present embodiment is applied to a laser annealing apparatus. Alternatively, the laser irradiation apparatus according to the present embodiment can also be applied to an apparatus other than a laser annealing apparatus.

Thus far, the invention made by the present inventors has been described in concrete terms on the basis of the embodiments, but the present invention is not limited to the foregoing embodiments, and it is needless to say that various modifications are possible within the scope that does not depart from the spirit of the present invention.

This application claims priority to Japanese Patent Application No. 2016-183676, filed on Sep. 21, 2016, and the entire disclosure of which is incorporated herein.

REFERENCE SIGNS LIST 1, 1_1 to 1_4, 2 laser irradiation apparatus
10 flotation unit
11, 31, 41, 51 conveying unit
12, 32_1 to 32_4, 42_1, 42_2, 52_1, 52_2 holding mechanism
13, 53 moving mechanism
14 laser light source
15, 25 laser beam, laser irradiation position
16 workpiece
18 rotating mechanism
60 flotation unit
61_1 to 61_4 conveying unit
62_1 to 62_4 holding mechanism
63_1 to 63_4 moving mechanism
65 laser beam, laser irradiation position
66 workpiece
68 rotating mechanism

The invention claimed is:

1. A laser irradiation apparatus comprising:
a laser generating device configured to generate a laser beam;
a flotation unit configured to cause a workpiece to float, the workpiece being to be irradiated with the laser beam; and
a conveying unit configured to convey the floating workpiece, wherein
the conveying unit conveys the workpiece with the conveying unit holding the workpiece at a position where the conveying unit does not overlap an irradiation position of the laser beam as viewed in a plan view,
the flotation unit is provided with a rotating mechanism that rotates the workpiece with the rotating mechanism holding a horizontal surface of the workpiece,
the laser irradiation apparatus, after conveying the workpiece with the use of the conveying unit and irradiating the workpiece with the laser beam, rotates the workpiece with the use of the rotating mechanism and conveys the workpiece again to have the workpiece irradiated with the laser beam,
the conveying unit includes
a holding mechanism configured to hold the workpiece, and
a moving mechanism coupled to the holding mechanism, the moving mechanism being configured to move in the conveyance direction along an edge portion of the flotation unit in a direction perpendicular to the conveyance direction, and
the workpiece is conveyed as the moving mechanism moves in the conveyance direction with the holding mechanism holding the workpiece, and
the holding mechanism holds the workpiece by sucking a surface of the workpiece that is opposite to a surface to be irradiated with the laser beam.

2. The laser irradiation apparatus according to claim 1, wherein
the rotating mechanism is configured to rotate the workpiece by 180 degrees with the rotating mechanism holding the horizontal surface of the workpiece, and
the laser irradiation apparatus, after conveying the workpiece in the conveyance direction with the use of the conveying unit and irradiating the workpiece with the laser beam, rotates the workpiece by 180 degrees with the use of the rotating mechanism and conveys the workpiece in a direction opposite to the conveyance direction to have the workpiece irradiated with the laser beam.

3. The laser irradiation apparatus according to claim 1, wherein
the laser beam is applied onto a portion of the workpiece that extends in a direction perpendicular to the conveyance direction while the workpiece is being conveyed, and
the conveying unit conveys the workpiece with the conveying unit holding an edge portion of the workpiece in the direction perpendicular to the conveyance direction.

4. A laser irradiation apparatus comprising:
a laser generating device configured to generate a laser beam;

a flotation unit configured to cause a workpiece to float, the workpiece being to be irradiated with the laser beam; and a conveying unit configured to convey the floating workpiece, wherein the flotation unit includes first to fourth regions over which the workpiece is conveyed, the conveying unit includes a first conveying unit configured to convey the workpiece from the first region to the second region, a second conveying unit configured to convey the workpiece from the second region to the third region, a third conveying unit configured to convey the workpiece from the third region to the fourth region, and a fourth conveying unit configured to convey the workpiece from the fourth region to the first region, the workpiece is irradiated with the laser beam while the workpiece is being conveyed from the first region to the second region, the first conveying unit conveys the workpiece with the first conveying unit holding the workpiece at a position where the first conveying unit does not overlap an irradiation position of the laser beam as viewed in a plan view, the flotation unit is rectangular in shape as viewed in a plan view, the first conveying unit moves along a first side of the flotation unit to convey the workpiece from the first region to the second region, the second conveying unit moves along a second side of the flotation unit to convey the workpiece from the second region to the third region, the third conveying unit moves along a third side of the flotation unit to convey the workpiece from the third region to the fourth region, the fourth conveying unit moves along a fourth side of the flotation unit to convey the workpiece from the fourth region to the first region, the laser beam is applied onto a portion of the workpiece while the workpiece is being conveyed from the first region to the second region, a rotating mechanism is provided in any one of the first to fourth regions of the flotation unit, the rotating mechanism being configured to rotate the workpiece by 180 degrees with the rotating mechanism holding a horizontal surface of the workpiece, the laser irradiation apparatus is configured to convey the workpiece from the first region to the second region with the use of the first conveying unit and irradiate the workpiece with the laser beam, rotate the workpiece by 180 degrees with the use of the rotating mechanism while conveying the workpiece with the use of the second to fourth conveying units, and convey the workpiece from the first region to the second region with the use of the first conveying unit and irradiate the workpiece with the laser beam.

5. The laser irradiation apparatus according to claim 4, wherein the first conveying unit includes a holding mechanism configured to hold the workpiece, and a moving mechanism coupled to the holding mechanism, the moving mechanism being configured to move in the conveyance direction along an edge portion of the flotation unit in a direction perpendicular to the conveyance direction, and the workpiece is conveyed as the moving mechanism moves in the conveyance direction with the holding mechanism holding the workpiece.

6. The laser irradiation apparatus according to claim 5, wherein the holding mechanism holds the workpiece by sucking a surface of the workpiece that is opposite to a surface to be irradiated with the laser beam.

7. The laser irradiation apparatus according to claim 5, wherein the holding mechanism holds the workpiece by pinching the workpiece at both surfaces thereof.

8. A laser irradiation apparatus comprising:

a laser generating device configured to generate a laser beam;

a flotation unit configured to cause a workpiece to float, the workpiece being to be irradiated with the laser beam; and a conveying unit configured to convey the workpiece, wherein the workpiece has a quadrangular planar shape with four sides, the conveying unit includes a holding mechanism configured to hold the workpiece, the holding mechanism holds only one of the four sides of the workpiece, the holding mechanism is located at a position where the holding mechanism is not irradiated with the laser beam while the workpiece is being conveyed, and the holding mechanism holds the workpiece by sucking a surface of the workpiece that is opposite to a surface to be irradiated with the laser beam.

9. A laser irradiation method of conveying a workpiece with a conveying unit while causing the workpiece to float with the use of a flotation unit and irradiating the workpiece with a laser beam, wherein the conveying unit conveys the workpiece with the conveying unit holding the workpiece at a position where the conveying unit does not overlap an irradiation position of the laser beam as viewed in a plan view, and after the workpiece is conveyed with the use of the conveying unit and the workpiece is irradiated with the laser beam, the workpiece is rotated with the use of a rotating mechanism provided on the flotation unit with the rotating mechanism holding a horizontal surface of the workpiece, and the workpiece is conveyed again to be irradiated with the laser beam, and a holding mechanism included in the conveying unit holds the workpiece by sucking a surface of the workpiece that is opposite to a surface to be irradiated with the laser beam.

10. The laser irradiation method according to claim 9, wherein, after the workpiece is conveyed in a conveyance direction with the use of the conveying unit and the workpiece is irradiated with the laser beam, the workpiece is rotated by 180 degrees with the use of a rotating mechanism provided on the flotation unit with the rotating mechanism holding a horizontal surface of the workpiece, and the workpiece is conveyed in a direction opposite to the conveyance direction to be irradiated with the laser beam.

11. The laser irradiation method according to claim 9, wherein the laser beam is applied onto a portion of the workpiece that extends in a direction perpendicular to a conveyance direction while the workpiece is being conveyed, and the conveying unit conveys the workpiece with the conveying unit holding an edge portion of the workpiece in a direction perpendicular to the conveyance direction.

12. A laser irradiation method of conveying a workpiece with first to fourth conveying units while causing the workpiece to float with the use of a flotation unit and irradiating the workpiece with a laser beam, wherein
the workpiece is conveyed from a first region to a second region with the use of the first conveying unit,
the workpiece is conveyed from the second region to a third region with the use of the second conveying unit,
the workpiece is conveyed from the third region to a fourth region with the use of the third conveying unit,
the workpiece is conveyed from the fourth region to the first region with the use of the fourth conveying unit,
the workpiece is irradiated with the laser beam while the workpiece is being conveyed from the first region to the second region,
the first conveying unit conveys the workpiece with the first conveying unit holding the workpiece at a position where the first conveying unit does not overlap an irradiation position of the laser beam as viewed in a plan view, and
a holding mechanism included in the first conveying unit holds the workpiece by sucking a surface of the workpiece that is opposite to a surface to be irradiated with the laser beam.

13. The laser irradiation method according to claim 12, wherein
the flotation unit is rectangular in shape as viewed in a plan view,
the first conveying unit moves along a first side of the flotation unit to convey the workpiece from the first region to the second region,
the second conveying unit moves along a second side of the flotation unit to convey the workpiece from the second region to the third region,
the third conveying unit moves along a third side of the flotation unit to convey the workpiece from the third region to the fourth region, and
the fourth conveying unit moves along a fourth side of the flotation unit to convey the workpiece from the fourth region to the first region.

14. A laser irradiation method of conveying a workpiece with a conveying unit while causing the workpiece to float with the use of a flotation unit and irradiating the workpiece with a laser beam, wherein
the workpiece has a quadrangular planar shape with four sides,
the conveying unit includes a holding mechanism configured to hold the workpiece,
the holding mechanism holds only one of the four sides of the workpiece and holds the workpiece at a position where the workpiece is not irradiated with the laser beam while the workpiece is being conveyed, and
a holding mechanism holds the workpiece by sucking a surface of the workpiece that is opposite to a surface to be irradiated with the laser beam.

15. A method of manufacturing a semiconductor device, the method comprising steps of:
(a) forming an amorphous film on a substrate; and
(b) irradiating the amorphous film with a laser beam to crystalize the amorphous film, wherein
the step of (b) is a step of conveying the substrate with the a conveying unit while causing the substrate to float with the use of a flotation unit and irradiating the amorphous film with the laser beam,
the conveying unit conveys the substrate with the conveying unit holding the substrate at a position where the conveying unit does not overlap an irradiation position of the laser beam as viewed in a plan view,
after the substrate is conveyed with the use of the conveying unit and the substrate is irradiated with the laser beam, the substrate is rotated with the use of a rotating mechanism provided on the flotation unit with the rotating mechanism holding a horizontal surface of the substrate, and the substrate is conveyed again to be irradiated with the laser beam, and
a holding mechanism included in the conveying unit holds the workpiece by sucking a surface of the workpiece that is opposite to a surface to be irradiated with the laser beam.

16. A method of manufacturing a semiconductor device, the method comprising steps of:
(a) forming an amorphous film on a substrate; and
(b) irradiating the amorphous film with a laser beam to crystalize the amorphous film, wherein
the step of (b) is a step of conveying the substrate with first to fourth conveying units while causing the substrate to float with the use of a flotation unit and irradiating the amorphous film with the laser beam,
the substrate is conveyed from a first region to a second region with the use of the first conveying unit,
the substrate is conveyed from the second region to a third region with the use of the second conveying unit,
the substrate is conveyed from the third region to a fourth region with the use of the third conveying unit,
the substrate is conveyed from the fourth region to the first region with the use of the fourth conveying unit,
the substrate is irradiated with the laser beam while the substrate is being conveyed from the first region to the second region,
the first conveying unit conveys the substrate with the first conveying unit holding the substrate at a position where the first conveying unit does not overlap an irradiation position of the laser beam as viewed in a plan view, and
a holding mechanism included in the first conveying unit holds the workpiece by sucking a surface of the workpiece that is opposite to a surface to be irradiated with the laser beam.

17. A method of manufacturing a semiconductor device, the method comprising steps of:
(a) forming an amorphous film on a substrate; and
(b) irradiating the amorphous film with a laser beam to crystalize the amorphous film, wherein
the step of (b) is a step of conveying the substrate with a conveying unit while causing the substrate to float with the use of a flotation unit and irradiating the amorphous film with the laser beam,
the substrate has a quadrangular planar shape with four sides,
the conveying unit includes a holding mechanism configured to hold the substrate,
the holding mechanism holds only one of the four sides of the substrate and holds the substrate at a position where the substrate is not irradiated with the laser beam while the substrate is being conveyed, and
a holding mechanism holds the workpiece by sucking a surface of the workpiece that is opposite to a surface to be irradiated with the laser beam.

* * * * *